United States Patent
Wu et al.

(10) Patent No.: US 10,797,827 B2
(45) Date of Patent: Oct. 6, 2020

(54) GRANT-FREE TRANSMISSION METHOD AND APPARATUS

(71) Applicant: HUAWEI TECHNOLOGIES CO., LTD., Shenzhen (CN)

(72) Inventors: Yiqun Wu, Shanghai (CN); Xiuqiang Xu, Shanghai (CN); Yan Chen, Shanghai (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 18 days.

(21) Appl. No.: 16/208,505

(22) Filed: Dec. 3, 2018

(65) Prior Publication Data

US 2019/0103942 A1    Apr. 4, 2019

Related U.S. Application Data

(63) Continuation of application No. PCT/CN2017/083085, filed on May 4, 2017.

(30) Foreign Application Priority Data

Jun. 3, 2016 (CN) .......................... 2016 1 0390233

(51) Int. Cl.
| | |
|---|---|
| *H04L 1/00* | (2006.01) |
| *H04L 27/26* | (2006.01) |
| *H04L 5/00* | (2006.01) |
| *H04W 74/02* | (2009.01) |
| *H04J 13/10* | (2011.01) |
| *H04W 76/11* | (2018.01) |

(Continued)

(52) U.S. Cl.
CPC ........ *H04L 1/0071* (2013.01); *H03M 13/271* (2013.01); *H04J 13/10* (2013.01); *H04L 5/0048* (2013.01); *H04L 27/2607* (2013.01); *H04L 27/2613* (2013.01); *H04W 74/02* (2013.01); *H04W 76/11* (2018.02); *H04W 74/08* (2013.01)

(58) Field of Classification Search
None
See application file for complete search history.

(56) References Cited

U.S. PATENT DOCUMENTS

| | | | |
|---|---|---|---|
| 2014/0254544 A1 | 9/2014 | Kar Kin Au et al. | |
| 2015/0229413 A1* | 8/2015 | Takeda | H04L 5/0053 370/329 |

(Continued)

FOREIGN PATENT DOCUMENTS

| | | |
|---|---|---|
| CN | 104272688 A | 1/2015 |
| CN | 105027600 A | 11/2015 |

(Continued)

*Primary Examiner* — Saba Tsegaye
(74) *Attorney, Agent, or Firm* — Westerman, Hattori, Daniels & Adrian, LLP

(57) ABSTRACT

Embodiments of this application provide a grant-free transmission method, a terminal device, and a network device, to improve grant-free transmission reliability. The grant-free transmission method includes: obtaining, by a terminal device, an interleaving pattern based on at least one of a cell identity of the terminal device, a terminal device identifier, time-domain resource information, and frequency-domain resource information; interleaving data based on the obtained interleaving pattern, to obtain interleaved data; and sending the interleaved data.

5 Claims, 8 Drawing Sheets

(51) Int. Cl.
*H03M 13/27* (2006.01)
*H04W 74/08* (2009.01)

(56) References Cited

U.S. PATENT DOCUMENTS

| | | |
|---|---|---|
| 2015/0381318 A1 | 12/2015 | Zhang et al. |
| 2016/0323911 A1 | 11/2016 | Au et al. |
| 2016/0338107 A1 | 11/2016 | Zeng et al. |
| 2017/0156131 A1* | 6/2017 | Kimura ............... H04J 11/00 |
| 2017/0251454 A1 | 8/2017 | Yang et al. |
| 2017/0324501 A1* | 11/2017 | Uchiyama ......... H03M 13/6508 |
| 2018/0139080 A1* | 5/2018 | Kim .................... H04L 1/0643 |
| 2019/0140775 A1* | 5/2019 | Yoon ................. H04W 72/0413 |

FOREIGN PATENT DOCUMENTS

| | | |
|---|---|---|
| CN | 105264172 A | 1/2016 |
| EP | 2955891 A1 | 12/2015 |
| WO | 2016018046 A1 | 2/2016 |

* cited by examiner

GRANT-FREE TRANSMISSION METHOD AND APPARATUS

CROSS-REFERENCE TO RELATED APPLICATIONS

This application is a continuation of International Patent Application No. PCT/CN2017/083085, filed on May 4, 2017, which claims priority to Chinese Patent Application No. 201610390233.6, filed on Jun. 3, 2016, The disclosures of the aforementioned applications are hereby incorporated by reference in their entireties.

TECHNICAL FIELD

This application relates to the communications field, and more specifically, to a grant-free transmission method and an apparatus.

BACKGROUND

In a typical wireless communications network (for example, Long Term Evolution (Long Term Evolution, LTE)), selection of an uplink shared channel (uplink shared channel) is based on a scheduling/grant (Scheduling/Grant) mechanism and is completely controlled by a base station (Base Station, BS). In the mechanism, user equipment (User Equipment, UE) first sends an uplink scheduling request to the BS. After receiving the request, the BS sends an uplink grant to the UE, to inform the UE of an uplink transmission resource allocated to the UE. Accordingly, the UE transmits data on the granted uplink transmission resource.

Massive user access is one of typical application scenarios of a next-generation communications network. During massive user access, using the foregoing scheduling/grant mechanism not only causes enormous signaling transmission overheads and resource allocation scheduling pressure of a BS, but also results in a considerable transmission latency. In view of this, the next-generation communications network uses a grant-free (Grant Free) transmission mode to support massive user access.

In the foregoing grant-free transmission for massive user access, because a plurality of UEs are allowed to perform contention-based transmission on a same time-frequency resource, a contention-caused collision occurs, thereby reducing grant-free transmission reliability.

Therefore, to ensure ultra-reliable and low-latency grant-free transmission, a method is urgently required to provide additional transmission assurance for some UEs that have special service requirements.

SUMMARY

Embodiments of this application provide a grant-free transmission method, a terminal device, and a network device, to improve grant-free transmission reliability.

According to a first aspect, a grant-free transmission method is provided, including: obtaining, by a terminal device, an interleaving pattern based on at least one of a cell identity of the terminal device, a terminal device identifier, time-domain resource information, and frequency-domain resource information; interleaving data based on the obtained interleaving pattern, to obtain interleaved data; and sending the interleaved data.

In an optional implementation, the obtaining, by a terminal device, an interleaving pattern based on at least one of a cell identity of the terminal device, a terminal device identifier, time-domain resource information, and frequency-domain resource information is specifically:

obtaining, by the terminal device, the interleaving pattern based on at least one of the cell identity of the terminal device, the terminal device identifier, the time-domain resource information, and the frequency-domain resource information by using a formula.

In an optional implementation, the obtaining, by the terminal device, the interleaving pattern based on at least one of the cell identity of the terminal device, the terminal device identifier, the time-domain resource information, and the frequency-domain resource information by using a formula is specifically:

obtaining the interleaving pattern based on the cell identity N of the terminal device, the terminal device identifier n, a frame number or timeslot number m, and a subband number d by using the following formulas:

$$\pi_i(x) = \mathrm{mod}(a + f_1 x + f_2 x^2 + K,), x = 0, \ldots, K-1, \text{ and}$$

$$a = \mathrm{mod}\left(d2^8 + \sum_{s=0}^{7} f_p(8m+s)2^s + n, K\right),$$

where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; and the base interleaving matrix includes K columns, where K is a positive integer.

In an optional implementation, the obtaining, by the terminal device, the interleaving pattern based on at least one of the cell identity of the terminal device, the terminal device identifier, the time-domain resource information, and the frequency-domain resource information by using a formula is specifically:

obtaining the interleaving pattern based on the cell identity N of the terminal device, the terminal device identifier n, a frame number or timeslot number m, and a subband number d by using the following formulas:

$$\pi_i(x) = \mathrm{mod}(a + f_1 x + f_2 x^2, K), x = 0, \ldots, K-1, \text{ and}$$

$$a = \mathrm{mod}\left(d2^8 + \sum_{s=0}^{7} f_p(8m+s)2^s + n, K\right),$$

where $f_p(.)$ is generated by using a pseudo random sequence, and an initial value $c_{init}$ is N; K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

In an optional implementation, the method further includes:

obtaining a Code Division Multiple Access coding scheme index c based on the cell identity N of the terminal device, the terminal device identifier n, the frame number or timeslot number m, and the subband number d by using the following formula:

$$c = \text{mod}\left(\left\lfloor\left(d2^8 + \sum_{s=0}^{7} f_p(8m+s)2^s + n\right)/K\right\rfloor, T\right),$$

where

T is a positive integer, and $\lfloor \ \rfloor$ represents rounding down to a nearest integer;

selecting a Code Division Multiple Access coding scheme from a Code Division Multiple Access coding scheme set based on the Code Division Multiple Access coding scheme index, where the Code Division Multiple Access coding scheme set includes T Code Division Multiple Access coding schemes; and performing Code Division Multiple Access encoding on the data based on the selected Code Division Multiple Access coding scheme; and the sending the interleaved data is specifically:

sending data obtained through interleaving and Code Division Multiple Access encoding.

In an optional implementation, the method further includes:

obtaining a pilot index based on the cell identity N of the terminal device, the terminal device identifier n, the frame number or timeslot number m, and the subband number d by using the following formula:

$$b = \text{mod}\left(d2^8 + \sum_{s=0}^{7} f_p(8m+s)2^s + n, KT\right),$$

where obtaining a pilot sequence from a pilot sequence set based on the pilot index b, where the pilot sequence set includes KT pilot sequences; and sending the obtained pilot sequence.

In an optional implementation, the obtaining, by a terminal device, an interleaving pattern based on at least one of a cell identity of the terminal device, a terminal device identifier, time-domain resource information, and frequency-domain resource information is specifically:

determining an interleaving pattern set from a plurality of prestored interleaving pattern sets based on at least one of the cell identity of the terminal device, the time-domain resource information, and the frequency-domain resource information; and obtaining the interleaving pattern from the determined interleaving pattern set.

In an optional implementation, the determining an interleaving pattern set from a plurality of prestored interleaving pattern sets based on at least one of the cell identity of the terminal device, the time-domain resource information, and the frequency-domain resource information is specifically:

generating a set index based on at least one of the cell identity of the terminal device, the time-domain resource information, and the frequency-domain resource information; and obtaining the interleaving pattern set from the plurality of prestored interleaving pattern sets based on the set index.

In an optional implementation, the obtaining the interleaving pattern from the determined interleaving pattern set is specifically:

obtaining the interleaving pattern from the determined interleaving pattern set based on the terminal device identifier.

In an optional implementation, the obtaining the interleaving pattern from the determined interleaving pattern set based on the terminal device identifier is specifically:

generating an element index based on the terminal device identifier; and obtaining the interleaving pattern from the determined interleaving pattern set based on the element index.

According to a second aspect, a grant-free transmission method is provided, including: receiving interleaved data sent by a terminal device, where the interleaved data is obtained after the terminal device interleaves data by using an interleaving pattern, and the interleaving pattern is obtained by the terminal device based on at least one of a cell identity of the terminal device, a terminal device identifier, time-domain resource information, and frequency-domain resource information; and deinterleaving the interleaved data by using the interleaving pattern.

In an optional implementation, the interleaving pattern used by the terminal device to interleave the data is obtained by the terminal device based on at least one of the cell identity of the terminal device, the terminal device identifier, the time-domain resource information, and the frequency-domain resource information by using a formula.

In an optional implementation, the interleaving pattern used by the terminal device to interleave the data is obtained by the terminal device based on the cell identity N of the terminal device, the terminal device identifier n, a frame number or timeslot number m, and a subband number d by using the following formulas:

$$\pi_i(x) = \text{mod}(a + f_1 x + f_2 x^2, K), x = 0, \ldots, K-1, \text{ and}$$

$$a = \text{mod}\left(d2^8 + \sum_{s=0}^{7} f_p(8m+s)2^s + n, K\right),$$

where $f_p(.)$ is generated by using a pseudo random sequence, and an initial value $c_{init}$ is N; K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

In an optional implementation, the data is data that is encoded by the terminal by using a Code Division Multiple Access coding scheme, the Code Division Multiple Access coding scheme is obtained by the terminal device from a Code Division Multiple Access coding scheme set by using a Code Division Multiple Access coding scheme index c, and the Code Division Multiple Access coding scheme index c is obtained by the terminal device based on the cell identity N of the terminal device, the terminal device identifier n, a frame number or timeslot number m, and a subband number d by using the following formula:

$$c = \text{mod}\left(\left\lfloor\left(d2^8 + \sum_{s=0}^{7} f_p(8m+s)2^s + n\right)/K\right\rfloor, T\right),$$

where

T is a positive integer, and $\lfloor \ \rfloor$ represents rounding down to a nearest integer.

In an optional implementation, the method further includes:

receiving a pilot sent by the terminal device, where the pilot is obtained by the terminal device from a pilot set based on the a index b, and the pilot index b is obtained by the terminal device based on the terminal device identifier n, the cell identity N of the terminal device, the frame number or timeslot number m, and the subband number d by using the following formula:

$$b = \mathrm{mod}\left(d2^8 + \sum_{s=0}^{7} f_p(8m+s)2^s + n, KT\right),$$

where

K and T are positive integers, and the pilot set includes KT pilots.

According to a third aspect, a grant-free transmission method is provided, including:

obtaining, by a terminal device, an interleaving pattern from an interleaving pattern set, where the interleaving pattern set is determined by the terminal device based on received indication information, and the indication information is used to indicate one or more interleaving pattern sets;

interleaving data based on the obtained interleaving pattern, to obtain interleaved data; and sending the interleaved data.

In an optional implementation, the indication information includes a set index;

before the obtaining an interleaving pattern from an interleaving pattern set, the method further includes: determining the interleaving pattern set from a plurality of prestored interleaving pattern sets based on the set index included in the indication information; and the obtaining an interleaving pattern from an interleaving pattern set is specifically: obtaining the interleaving pattern from the interleaving pattern set that is determined based on the set index.

In an optional implementation, the obtaining an interleaving pattern from an interleaving pattern set is specifically:

obtaining the interleaving pattern from the interleaving pattern set based on an element index.

According to a fourth aspect, a grant-free transmission method is provided, including:

receiving interleaved data sent by a terminal device, where the interleaved data is obtained after the terminal device interleaves data by using an interleaving pattern in an interleaving pattern set, the interleaving pattern set is determined by the terminal device based on indication information sent by a network device, and the indication information is used to indicate one or more interleaving pattern sets; and deinterleaving the interleaved data.

In an optional implementation, the indication information includes a set index, which is used by the terminal device to determine the interleaving pattern set from a plurality of prestored interleaving pattern sets.

According to a fifth aspect, a grant-free transmission method is provided, including: obtaining, by a terminal device, an interleaving pattern from an interleaving pattern set;

obtaining a Code Division Multiple Access coding scheme from a Code Division Multiple Access coding scheme set;

interleaving data based on the interleaving pattern;

performing Code Division Multiple Access encoding on the data based on the Code Division Multiple Access coding scheme; and sending data obtained through interleaving and Code Division Multiple Access encoding.

In an optional implementation, the method further includes: determining the interleaving pattern set from a plurality of prestored interleaving pattern sets based on at least one of a cell identity of the terminal device, a terminal device identifier, time-domain resource information, and frequency-domain resource information; and determining the interleaving pattern from the determined interleaving pattern set.

In an optional implementation, before the obtaining, by a terminal device, an interleaving pattern from an interleaving pattern set, the method further includes:

generating a first set index based on at least one of the cell identity of the terminal device, the terminal device identifier, the time-domain resource information, and the frequency-domain resource information; and determining the interleaving pattern set from the plurality of prestored interleaving pattern sets based on the first set index; and the obtaining, by a terminal device, an interleaving pattern from an interleaving pattern set is specifically:

determining the interleaving pattern from the determined interleaving pattern set.

In an optional implementation, the obtaining, by a terminal device, an interleaving pattern from an interleaving pattern set is specifically:

generating a first element index based on the terminal device identifier; and determining the interleaving pattern from the interleaving pattern set based on the first element index.

In an optional implementation, before the obtaining, by the terminal device, a Code Division Multiple Access coding scheme from a Code Division Multiple Access coding scheme set, the method further includes:

generating a second set index based on at least one of the cell identity of the terminal device, the terminal device identifier, the time-domain resource information, and the frequency-domain resource information; and determining the Code Division Multiple Access coding scheme set from the plurality of prestored Code Division Multiple Access coding scheme sets based on the second set index; and the obtaining, by the terminal device, a Code Division Multiple Access coding scheme from a Code Division Multiple Access coding scheme set is specifically:

determining the Code Division Multiple Access coding scheme from the determined Code Division Multiple Access coding scheme set.

In an optional implementation, the obtaining, by the terminal device, a Code Division Multiple Access coding scheme from a Code Division Multiple Access coding scheme set is specifically:

generating a second element index based on the terminal device identifier; and determining the Code Division Multiple Access coding scheme from the Code Division Multiple Access coding scheme set based on the second element index.

In an optional implementation, the method further includes:

obtaining a pilot sequence; and the obtaining a Code Division Multiple Access coding scheme from a Code Division Multiple Access coding scheme set is specifically:

obtaining, from the Code Division Multiple Access coding scheme set based on a correspondence between a pilot sequence and a Code Division Multiple Access coding scheme, a Code Division Multiple Access coding scheme corresponding to the obtained pilot sequence; and/or the obtaining an interleaving pattern from an interleaving pattern set is specifically:

obtaining, from the interleaving pattern set based on a correspondence between a pilot sequence and an interleaving pattern, an interleaving pattern corresponding to the obtained pilot sequence.

In an optional implementation, the method further includes:

receiving first indication information sent by a network device, where the first indication information is used to indicate one or more interleaving pattern sets; and the obtaining an interleaving pattern from an interleaving pattern set is specifically: obtaining the interleaving pattern from the interleaving pattern set indicated by the first indication information.

In an optional implementation, the method further includes:

receiving second indication information sent by the network device, where the second indication information is used to indicate one or more Code Division Multiple Access coding scheme sets; and the obtaining a Code Division Multiple Access coding scheme from a Code Division Multiple Access coding scheme set is specifically: obtaining the Code Division Multiple Access coding scheme from the Code Division Multiple Access coding scheme set indicated by the second indication information.

According to a sixth aspect, a grant-free transmission method is provided, including:

receiving data obtained through interleaving and Code Division Multiple Access encoding and sent by a terminal device; and performing, based on an interleaving pattern in an interleaving pattern set and a Code Division Multiple Access coding scheme in a Code Division Multiple Access coding scheme set, deinterleaving and Code Division Multiple Access decoding on the data obtained through interleaving and Code Division Multiple Access encoding, to obtain data after deinterleaving and Code Division Multiple Access decoding.

In an optional implementation, the method further includes:

sending a first set index to the terminal device, where the first set index indicates one or more interleaving pattern sets and is used by the terminal device to obtain, from a prestored interleaving pattern set, the one or more interleaving pattern sets indicated by the first set index, so as to obtain, from the obtained interleaving pattern set, the interleaving pattern used for data interleaving.

In an optional implementation, the method further includes:

sending a second set index to the terminal device, where the second set index indicates one or more Code Division Multiple Access coding scheme sets and is used by the terminal device to obtain, from a prestored Code Division Multiple Access coding scheme set, the one or more Code Division Multiple Access coding scheme sets indicated by the second set index, so as to obtain, from the obtained Code Division Multiple Access coding scheme set, the Code Division Multiple Access coding scheme used for dataencoding.

In an optional implementation, the method further includes:

receiving a pilot sequence sent by the terminal device, where the Code Division Multiple Access coding scheme obtained by the terminal device is a Code Division Multiple Access coding scheme that is corresponding to the pilot sequence and that is obtained by the terminal device from the Code Division Multiple Access coding scheme set based on a correspondence between a pilot sequence and a Code Division Multiple Access coding scheme; and/or the interleaving pattern obtained by the terminal device is an interleaving pattern that is corresponding to the pilot sequence and that is obtained by the terminal device from the interleaving pattern set based on a correspondence between a pilot sequence and an interleaving pattern.

According to a seventh aspect, a terminal device is provided, including a processor and a transceiver that are capable of performing the method in any optional implementation of the first aspect, and/or the third aspect, and/or the fifth aspect.

According to an eighth aspect, a network device is provided, including a processor and a transceiver that are capable of performing the method in any optional implementation of the second aspect, and/or the fourth aspect, and/or the sixth aspect.

According to a ninth aspect, a computer storage medium is provided. The computer storage medium stores program code, and the program code may be used to instruct to perform the method in the first to the sixth aspects, or any optional implementation of the first to the sixth aspects.

DESCRIPTION OF EMBODIMENTS

Figure 1:
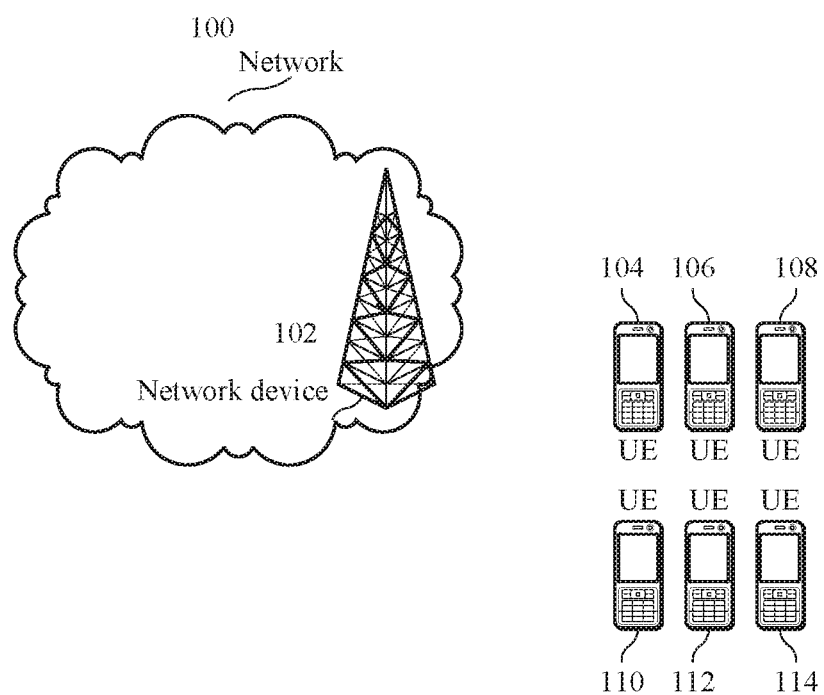
FIG. 1 is a diagram of an application scenario according to an embodiment of this application.

The following describes the technical solutions in the embodiments of this application with reference to the accompanying drawings in the embodiments of this application.

The terms such as "component", "module", and "system" used in this specification are used to indicate computer-related entities, hardware, firmware, combinations of hardware and software, software, or software being executed. For example, a component may be but is not limited to a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from one component interacting with another component in a local system, a distributed system, and/or across a network such as the Internet interacting with other systems by using the signal).

It should be understood that, the technical solutions in the embodiments of this application may be applied to various communications systems, for example, a Global System for Mobile Communications (Global System for Mobile Communications, GSM) system, a Code Division Multiple Access (Code Division Multiple Access, CDMA) system, a Wideband Code Division Multiple Access (Wideband Code Division Multiple Access, WCDMA) system, a Long Term Evolution (Long Term Evolution, LTE) system, an LTE frequency division duplex (Frequency Division Duplex, FDD) system, an LTE time division duplex (Time Division Duplex, TDD) system, a Universal Mobile Telecommunications System (Universal Mobile Telecommunications System, UMTS), and a future 5G communications system.

This application describes the embodiments with reference to a terminal device. The terminal device may also be referred to as user equipment (User Equipment, UE), an access terminal, a subscriber unit, a subscriber station, a mobile station, a mobile console, a remote station, a remote terminal, a mobile device, a user terminal, a terminal, a wireless communications device, a user agent, or a user apparatus. The access terminal may be a cellular phone, a cordless telephone set, a Session Initiation Protocol (Session Initiation Protocol, SIP) phone, a wireless local loop (Wireless Local Loop, WLL) station, a personal digital assistant (Personal Digital Assistant, PDA), a handheld device having a wireless communication function, a computing device, another processing device connected to a wireless modem, an in-vehicle device, a wearable device, a terminal device in a future 5G network, a terminal device in a future evolved PLMN network, or the like.

This application describes the embodiments with reference to a network device. The network device may be a device configured to communicate with a terminal device. For example, the network device may be a base transceiver station (Base Transceiver Station, BTS) in a GSM system or CDMA, may be a NodeB (NodeB, NB) in a WCDMA system, or may be an evolved NodeB (Evolved Node B, eNB or eNodeB) in an LTE system. Alternatively, the network device may be a relay node, an access point, an in-vehicle device, a wearable device, a network-side device in a future 5G network, or a network device in a future evolved PLMN network.

Due to existence of a large quantity of connections, there is a significant difference between a future wireless communications system and an existing communications system. Because of the large quantity of connections, more resources need to be consumed for UE access, and more resources need to be consumed for scheduling signaling transmission related to data transmission of a terminal device.

FIG. 1 is a schematic architecture diagram of a communications system to which an embodiment of this application is applied. As shown in FIG. 1, the communications system 100 may include a network device 102 and terminal devices 104 to 114 (referred to as UE for short in the figure). The network device 102 and the terminal devices 104 to 114 are connected in a wireless manner, a wired manner, or another manner.

A network in this embodiment of this application may be a public land mobile network (Public Land Mobile Network, PLMN), a D2D network, an M2M network, or another network. FIG. 1 is merely an example of a simplified schematic diagram. The network may further include another network device that is not shown in FIG. 1.

This application proposes a grant-free (Grant Free) transmission solution. The grant-free transmission can adapt to a large quantity of MTC-type services in a future network and satisfy ultra-reliable and low-latency service transmission. The grant-free transmission may be used for uplink data transmission. A person skilled in the art can know that the grant-free transmission may have other names, such as spontaneous access, spontaneous multiple access, or contention-based multiple access. The grant-free transmission may be understood as including but not limited to any one or more of the following meanings, or a combination of some technical features in a plurality of the following meanings.

1. The grant-free transmission may mean: A network device pre-allocates a plurality of transmission resources to a terminal device and informs the terminal device of the plurality of transmission resources; when the terminal device has an uplink data transmission requirement, the terminal device selects at least one transmission resource from the plurality of transmission resources pre-allocated by the network device, and sends uplink data by using the selected transmission resource; and the network device detects, on one or more of the plurality of pre-allocated transmission resources, the uplink data sent by the terminal device. The detection may be blind detection, detection that is performed based on a control field in the uplink data, or detection performed in another manner.

2. The grant-free transmission may mean: A network device pre-allocates a plurality of transmission resources to a terminal device and informs the terminal device of the plurality of transmission resources, so that when the terminal device has an uplink data transmission requirement, the terminal device selects at least one transmission resource from the plurality of transmission resources pre-allocated by the network device, and sends uplink data by using the selected transmission resource.

3. The grant-free transmission may mean: Information about a plurality of pre-allocated transmission resources is obtained; and when there is an uplink data transmission requirement, at least one transmission resource is selected from the plurality of transmission resources, and uplink data is sent by using the selected transmission resource. An obtaining manner may be obtaining the information about a plurality of pre-allocated transmission resources from a network device.

4. The grant-free transmission may mean: A method for transmitting uplink data by a terminal device can be implemented without dynamic scheduling by a network device, where the dynamic scheduling may be a scheduling manner in which the network device indicates, by using signaling, a transmission resource for each uplink data transmission of the terminal device. Optionally, without dynamic scheduling by a network device may also be understood as persistent scheduling and/or semi-persistent scheduling. "A and/or B" mentioned in this embodiment of this application may represent A and B, A, or B. Details are not described. Optionally, implementing uplink data transmission of a terminal device can be understood as follows: At least two terminal devices are allowed to perform uplink data transmission on a same time-frequency resource. Optionally, the transmission resource may be a transmission resource of one or more transmission time units following a moment at which the UE receives the signaling. A transmission time unit may be a smallest time unit for one transmission, for example, a transmission time interval (Transmission Time Interval, TTI), where a value may be 1 ms; or a transmission time unit may be a preset transmission time unit.

5. The grant-free transmission may mean: A terminal device performs uplink data transmission without granting from a network device. The granting may mean: The terminal device sends an uplink scheduling request to the network device; and after receiving the scheduling request, the network device sends an uplink grant to the terminal device, where the uplink grant indicates an uplink transmission resource allocated to the terminal device.

6. The grant-free transmission may mean a contention-based transmission mode, and may specifically mean: A plurality of terminals perform uplink data transmission on a same pre-allocated time-frequency resource simultaneously without granting from a network device.

The data may include service data or signaling data.

The blind detection may be understood as detecting possibly arriving data when data arrival is unknown in advance. The blind detection may also be understood as detection without an explicit signaling indication.

The transmission resource may include but is not limited to one or a combination of the following resources: a time-domain resource, such as a radio frame, a subframe, and a symbol; a frequency-domain resource, such as a subcarrier and a resource block; a space-domain resource, such as a transmit antenna and a beam; a code-domain resource, such as a Sparse Code Multiple Access (Sparse Code Multiple Access, SCMA) codebook set, a Low Density Signature (Low Density Signature, LDS) set, and a CDMA code set; an uplink pilot resource; an interleaving resource; and a channel encoding scheme.

The foregoing transmission resource may be used for transmission performed by using a control mechanism including but not limited to the following: uplink power control, such as controlling an upper limit of uplink transmit power; modulation and coding scheme setting, such as setting a transport block size, a code rate, and a modulation order; and a retransmission mechanism, such as an HARQ mechanism.

A contention transmission unit (Contention Transmission Unit, CTU) may be a basic transmission resource for grant-free transmission. The CTU may be a transmission resource combined in terms of time, frequency, and code-domain; a transmission resource combined in terms of time, frequency, and pilot sequence; a transmission resource combined in terms of time, frequency, code-domain, and pilot sequence; a transmission resource combined in terms of time, frequency, code-domain, pilot sequence, and interleaving pattern; a transmission resource combined in terms of time, frequency, code-domain, pilot sequence, channel encoding scheme; or a transmission resource combined in terms of time, frequency, code-domain, pilot sequence, interleaving pattern, and channel encoding scheme. A code-domain resource corresponding to the CTU may be corresponding to a Code Division Multiple Access coding scheme described in the embodiments of this application.

Certainly, the CTU may alternatively be any other combination of various resources mentioned above. For brevity, various resources are not enumerated. Application content of another patent application PCT/CN2014/073084 describing a CTU may be understood as being incorporated by reference in content of the embodiments of this application, but the protection scope of the embodiments of this patent application is not limited to descriptive content of PCT/CN2014/073084.

An interleaving pattern set described in the embodiments of this application may include various interleaving patterns used to distinguish between users.

Optionally, in the embodiments of this application, different interleaving patterns in the interleaving pattern set may be based on different interleavers, or may be based on a same interleaver, but are corresponding to different parameters.

For ease of understanding, the following describes several implementations of an interleaver according to the embodiments of this application.

Implementation A

It is assumed that a size of a base interleaving matrix is L×K, that is, L rows and K columns, where L and K may be positive integers. LK input bits $\{b_0, b_1, \ldots, b_{LK-1}\}$ are arranged according to an order listed in Table 1:

TABLE 1

| $b_0$ | $b_L$ | ... | $b_{LK-L}$ |
|---|---|---|---|
| $b_1$ | $b_{L+1}$ | ... | $b_{LK-L+1}$ |
| ... | ... | ... | ... |
| $b_{L-1}$ | $b_{2L-1}$ | ... | $b_{LK-1}$ |

Interleaved bits are output by rows: $b_0, b_L, \ldots, b_{LK-L}, b_1, \ldots, b_{LK-L+1}, \ldots, b_{L-1}, \ldots, b_{LK-1}$. Different interleaving patterns may be obtained by sorting different columns of the base interleaving matrix, that is, a sequence of columns of the base interleaving matrix is changed. It is assumed that a before-sorting matrix of a terminal device n is $M^k = \{M_{ij}^K\}$, $i=1, \ldots, L, j=1, \ldots K$, and corresponding column sorting is $\pi_k$, where $\pi_k(j)$ represents a column sequence number of a column j after sorting. A matrix after the column sorting is $\tilde{M}_k$, where $$M_{i\pi_k(j)}^k = M_{ij}^k; \text{ and}$$

an interleaving pattern $\pi_k(j) = \mod(\pi(j) + a_k, K), j=0, \ldots, K-1$ is implemented, where $$a_k = \mod(n, K);$$

$$a = \mod\left(\sum_{s=0}^{7} f_p(8m+s)2^s + n, K\right); \text{ or}$$

$$a_k = \mod\left(d2^8 + \sum_{s=0}^{7} f_p(8m+s)2^s + n, K\right),$$

where

N is a cell identity of the terminal device; n is a terminal device identifier; m is a frame number or timeslot number (a number of a subframe or timeslot occupied by to-be-transmitted data or previously transmitted data of the terminal device), and d is a subband number (a number of a subband occupied by to-be-transmitted data or previously transmitted data of the terminal device).

It should be understood that in this implementation, alternatively, bits are input by rows and interleaved bits are output by columns; bits are input by rows and interleaved bits are output by rows; or bits are input by columns and interleaved bits are output by columns.

Implementation B

A Turbo code inner-interleaver may be used in this implementation. Interleaving may be implemented by using the following formula:

$$\pi_k(x) = \mathrm{mod}(a_k + f_1 x + f_2 x^2, K), x = 0, \ldots, K-1, \text{ where}$$

K is a size of a to-be-transmitted bit block, where K may be a positive integer; values of $f_1$ and $f_2$ are related to K; $a_k$ represents a quantity of times that cyclic shift is performed on an input bit; x represents a sequence number of the input bit; and $\pi_i(x)$ represents a sequence number for outputting an interleaved input bit; and $$a_k = \mathrm{mod}(n, K);$$

$$a = \mathrm{mod}\left(\sum_{s=0}^{7} f_P(8m+s)2^s + n, K\right); \text{ or}$$

$$a_k = \mathrm{mod}\left(d2^8 + \sum_{s=0}^{7} f_P(8m+s)2^s + n, K\right).$$

N is a cell identity of the terminal device; n is a terminal device identifier; m is a frame number or timeslot number (a number of a subframe or timeslot occupied by to-be-transmitted data or previously transmitted data of the terminal device), and d is a subband number (a number of a subband occupied by to-be-transmitted data or previously transmitted data of the terminal device).

Optionally, the parameters $f_1$ and $f_2$ depend on the size K of the code block. The values of $f_1$ and $f_2$ may be obtained by querying Table 2:

TABLE 2

| x | K | $f_1$ | $f_2$ |
|---|---|---|---|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 160 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |
| 26 | 240 | 29 | 60 |
| 27 | 248 | 33 | 62 |
| 28 | 256 | 15 | 32 |
| 29 | 264 | 17 | 198 |
| 30 | 272 | 33 | 68 |
| 31 | 280 | 103 | 210 |
| 32 | 288 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 512 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 217 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |

TABLE 2-continued

| x | K | f₁ | f₂ |
|---|---|----|----|
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2112 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 120 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 480 |
| 165 | 4672 | 37 | 146 |
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 158 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6080 | 47 | 190 |
| 188 | 6144 | 263 | 480 |

Implementation C

A sub-block interleaver may be used in this implementation. It is assumed that bits input to the interleaver are represented as $d_0^{(i)}, d_1^{(i)}, d_2^{(i)}, \ldots, d_{D-1}^{(i)}$, where D is a quantity of bits, and D may be a positive integer. An output bit sequence output from the interleaver is obtained according to the following description:

to-be-interleaved bits are arranged into a matrix; it is assumed that a quantity of columns of the matrix is $C_{subblock}^{CC}=32$ herein, and the columns of the matrix are sequentially numbered $0, 1, 2, \ldots$, and $C_{subblock}^{CC}-1$ from left to right;

a quantity $R_{subblock}^{CC}$ of rows of the matrix is determined, where $R_{subblock}^{CC}$ is a maximum integer satisfying the following inequality:

$$D \leq H(R_{subblock}^{CC} \times C_{subblock}^{CC}); \text{ and}$$

the rows of the matrix are numbered $0, 1, 2, \ldots$ and $R_{subblock}^{CC}-1$ from top to bottom.

If $(R_{subblock}^{CC} \times C_{subblock}^{CC}) > D$ holds true, $N_D = (R_{subblock}^{CC} \times C_{subblock}^{CC} - D)$ dummy bits (dummy bits) are added to a header, so that $y_k = <NULL>$ holds true, where $k = 0, 1, \ldots,$ and $N_D - 1$. Then, $Y_{N_D+k} = d_k^{(1)}$ ($k=0, 1, \ldots,$ and $D-1$) is obtained, and a bit sequence $y_k$ (starting from a bit $y_0$) is written row by row from a location of a row 0 and a column 0 in the matrix $(R_{subblock}^{TC} \times C_{subblock}^{TC})$ as follows:

$$\begin{bmatrix} y_0 & y_1 & y_2 & \cdots & y_{C_{subblock}^{CC}-1} \\ y_{C_{subblock}^{CC}} & y_{C_{subblock}^{CC}+1} & y_{C_{subblock}^{CC}+2} & \cdots & y_{2C_{subblock}^{CC}-1} \\ \vdots & \vdots & \vdots & \ddots & \vdots \\ y_{(R_{subblock}^{CC}-1) \times C_{subblock}^{CC}} & y_{(R_{subblock}^{CC}-1) \times C_{subblock}^{CC}+1} & y_{(R_{subblock}^{CC}-1) \times C_{subblock}^{CC}+2} & \cdots & y_{(R_{subblock}^{CC} \times C_{subblock}^{CC}-1)} \end{bmatrix}$$

Matrix column permutation is performed based on a mode $\langle P(j) \rangle_{j \in \{0, 1, \ldots, C_{subblock}^{CC}-1\}}$ listed in Table 1, where $P(j)$ represents an original column location of a $j^{th}$ permutated column. An $(R_{subblock}^{TC} \times C_{subblock}^{TC})$-dimension matrix obtained through column permutation is as follows:

$$\begin{bmatrix} y_{P(0)} & y_{P(1)} & y_{P(2)} & \cdots & y_{P(C_{subblock}^{CC}-1)} \\ y_{P(0)+C_{subblock}^{CC}} & y_{P(1)+C_{subblock}^{CC}} & y_{P(2)+C_{subblock}^{CC}} & \cdots & y_{P(C_{subblock}^{CC}-1)+C_{subblock}^{CC}} \\ \vdots & \vdots & \vdots & \ddots & \vdots \\ y_{P(0)+(R_{subblock}^{CC}-1)\times C_{subblock}^{CC}} & y_{P(1)+(R_{subblock}^{CC}-1)\times C_{subblock}^{CC}} & y_{P(2)+(R_{subblock}^{CC}-1)\times C_{subblock}^{CC}} & \cdots & y_{P(C_{subblock}^{CC}-1)+(R_{subblock}^{CC}-1)\times C_{subblock}^{CC}} \end{bmatrix}$$

Output from the interleaver is a bit sequence that is read column by column from the $(R_{subblock}^{CC} \times C_{subblock}^{CC})$-dimension matrix obtained through column permutation. Output interleaved bits are represented as $v_0^{(i)}, v_1^{(i)}, v_3^{(i)}, \ldots, v_{K_\Pi-1}^{(i)}$, where $v_0^{(i)}$ is corresponding to $y_{P(0)}$, $v_1^{(i)}$ is corresponding to $y_{P(0)=C_{subblock}^{CC}}, \ldots$, and $K_\Pi=(R_{subblock}^{CC} \times C_{subblock}^{CC})$.

TABLE 3

| Quantity $C_{subblock}^{CC}$ of columns | Column permutation mode: $<P(0), P(1), \ldots, P(C_{subblock}^{CC} - 1)>$ |
|---|---|
| 32 | <1, 17, 9, 25, 5, 21, 13, 29, 3, 19, 11, 27, 7, 23, 15, 31, 0, 16, 8, 24, 4, 20, 12, 28, 2, 18, 10, 26, 6, 22, 14, 30> |

Optionally, for interleaving implemented by using the sub-block interleaver, to-be-interleaved bits may be arranged into matrices with different quantities of columns, to distinguish between interleaving patterns. For example, when the foregoing sub-block interleaver is used for implementation, it is assumed that there are 32 columns, or a quantity of columns may be another option, for example, 8 or 16. Alternatively, during column permutation, different times of cyclic shift may be used for the column permutation, to distinguish between interleaving patterns.

Figure 2:
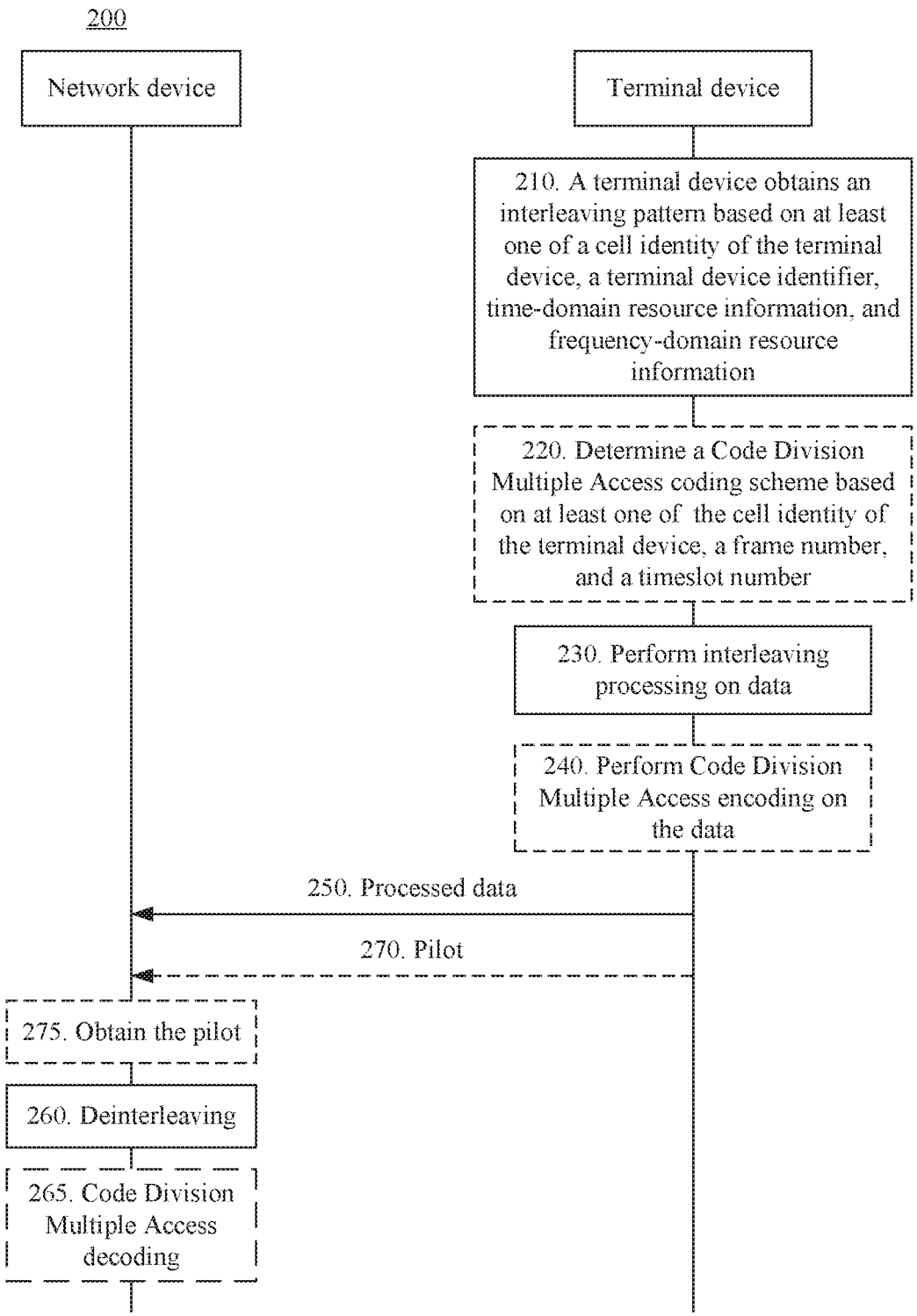
FIG. 2 is a schematic flowchart of a grant-free transmission method according to an embodiment of this application.

FIG. 2 is a schematic flowchart of a grant-free transmission method 200 according to an embodiment of this application.

210: A terminal device obtains an interleaving pattern based on at least one of a cell identity of the terminal device, a terminal device identifier, time-domain resource information, and frequency-domain resource information.

In this embodiment of this application, the interleaving pattern may represent an interleaving rule, and the interleaving rule may be implemented by using a formula (for example, the following formulas $\pi_i(j) = \mod(\pi(j)+a, K)$, $0=1, \ldots, K-1$ and $\pi_i(x) = \mod(a+f_1x+f_2x^2, K)$, $x=0, \ldots, K-1$). Alternatively, an interleaving pattern may be obtained by using a formula. In other words, specific implementation of the interleaving pattern may be learned by using a formula.

It may be understood that the obtaining an interleaving pattern may be: obtaining a parameter of an interleaving pattern, for example, the parameter a in the foregoing formula, and then obtaining the interleaving pattern that is implemented by using the formula.

Optionally, the terminal device may obtain the interleaving pattern based on at least one of the cell identity of the terminal device, the terminal device identifier, and the time-domain resource information by using a formula.

Optionally, the time-domain resource information mentioned in the embodiments of this application may be information about a time-domain resource allocated for transmission of to-be-sent data, or information about a time-domain resource allocated for latest data transmission. The time-domain resource information may include a frame number and a timeslot number.

Optionally, the frequency-domain resource information mentioned in the embodiments of this application may be information about a frequency-domain resource allocated for transmission of to-be-sent data, or information about a frequency-domain resource allocated for latest data transmission. The frequency-domain resource information may include a subband number.

Optionally, the cell identity of the terminal device may be an identifier of a management area to which the terminal device belongs. The management area may be a physical cell or a hypercell (which is a virtual cell).

Optionally, the terminal device identifier may be used to identify terminal device information, for example, an international mobile subscriber identity (International Mobile Subscriber Identity, IMSI), a temporary mobile station identity (Temporary Mobile Station Identity, TMSI), or an international mobile equipment identity (International Mobile Equipment Identity, IMEI).

The following describes several implementations of obtaining an interleaving pattern by using a formula.

In an implementation, the terminal device obtains the interleaving pattern based on the terminal device identifier n by using the following formulas:

$\pi_i(j) = \mod(\pi(j)+a, K), 0=1, \ldots, K-1$   Formula 1, and $a = \mod(n, K)$   Formula 2, where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix includes K columns, where K is a positive integer; and mod represents modulo processing.

Optionally, an interleaver corresponding to the interleaving pattern inputs bits by rows or columns of the base interleaving matrix, and outputs interleaved (that is, cyclic-shifted) bits by rows or columns of the base interleaving matrix.

In another implementation, the terminal device obtains the interleaving pattern based on the terminal device identifier n by using the following formulas:

$\pi_i(x) = \mod(a+f_1x+f_2x^2, K), x=0, \ldots, K-1$   Formula 3, and $a = \mod(n, K)$   Formula 2, where K is a size of a to-be-transmitted bit block; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

In another implementation, the terminal device obtains the interleaving pattern based on the cell identity N of the terminal device, the terminal device identifier n, and the frame number or timeslot number m by using the following formulas:

$$\pi_i(j) = \mod(\pi(j) + a, K), 0 = 1, \ldots, K-1, \text{ and} \quad \text{Formula 1}$$

$$a = \mod\left(\sum_{s=0}^{7} f_p(8m+s)2^s + n, K\right), \quad \text{Formula 4}$$

where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; and the base interleaving matrix includes K columns, where mod represents modulo processing.

Optionally, an interleaver corresponding to the interleaving pattern inputs bits by columns of the base interleaving matrix, and outputs interleaved bits by rows of the base interleaving matrix.

In another implementation, the terminal device obtains the interleaving pattern based on the cell identity N of the terminal device, the terminal device identifier n, and the frame number or timeslot number m by using the following formulas:

$$\pi_i(x) = \mod(a + f_1 x + f_2 x^2, K), x = 0, \ldots, K-1, \text{ and} \quad \text{Formula 3}$$

$$a = \mod\left(\sum_{s=0}^{7} f_p(8m+s)2^s + n, K\right), \quad \text{Formula 4}$$

where $f_p(.)$ is generated by using a pseudo random sequence, and an initial value $c_{init}$ is N; K is a size of a to-be-transmitted bit block; values of $f_1$ and $f_2$ are related to K; a represents a quantity of times that cyclic shift is performed on an input bit; x represents a sequence number of the input bit;

and $\pi_i(x)$ represents a sequence number for outputting an interleaved input bit.

In another implementation, the terminal device obtains the interleaving pattern based on the cell identity N of the terminal device, the terminal device identifier n, the frame number or timeslot number m, and the subband number d by using the following formulas:

$$\pi_i(j) = \mod(\pi(j) + a, K), 0 = 1, \ldots, K-1, \text{ and} \quad \text{Formula 1}$$

$$a = \mod\left(d2^8 + \sum_{s=0}^{7} f_p(8m+s)2^s + n, K\right), \quad \text{Formula 5}$$

where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix includes K columns, where K is a positive integer; and mod represents modulo processing.

Optionally, an interleaver corresponding to the interleaving pattern inputs bits by columns of the base interleaving matrix, and outputs interleaved bits by rows of the base interleaving matrix.

In another implementation, the terminal device obtains the interleaving pattern based on the cell identity N of the terminal device, the terminal device identifier n, the frame number or timeslot number m, and the subband number d by using the following formulas:

$$\pi_i(x) = \mod(a + f_1 x + f_2 x^2, K), x = 0, \ldots, K-1, \text{ and} \quad \text{Formula 3}$$

$$a = \mod\left(d2^8 + \sum_{s=0}^{7} f_p(8m+s)2^s + n, K\right), \quad \text{Formula 5}$$

where $f_p(.)$ is generated by using a pseudo random sequence, and an initial value $c_{init}$ is N; K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

It should be understood that in addition to the foregoing formulas for obtaining an interleaving pattern, another obtaining manner may also be used in this application.

For example, an interleaving pattern set may be determined from a plurality of prestored interleaving pattern sets based on at least one of the cell identity of the terminal device and the time-domain resource information. Specifically, a set index may be generated based on at least one of the cell identity of the terminal device and the time-domain resource information, so as to obtain the interleaving pattern set from the plurality of prestored interleaving pattern sets.

After the interleaving pattern set is obtained, the interleaving pattern may be obtained from the obtained interleaving pattern set. For example, the interleaving pattern may be obtained from the obtained interleaving pattern set based on the terminal device identifier. Specifically, an element index may be generated based on the terminal device identifier, and the interleaving pattern may be obtained from the interleaving pattern set based on the element index.

In the embodiments of this application, various indexes may be generated by a random number generator. Different initial values may be set for the random number generator by using a PN sequence, to generate different random sequences.

Optionally, in 220, the terminal device obtains a Code Division Multiple Access coding scheme based on at least one of the cell identity of the terminal device, the terminal device identifier, and the time-domain resource information.

Optionally, the terminal device may generate a Code Division Multiple Access coding scheme index based on at least one of the cell identity of the terminal device, the terminal device identifier, and the time-domain resource information by using a formula, and obtain the Code Division Multiple Access coding scheme from a Code Division Multiple Access coding scheme set based on the Code Division Multiple Access coding scheme index.

The following describes several implementations of obtaining a Code Division Multiple Access coding scheme index by using a formula.

In an implementation, the terminal device may obtain the Code Division Multiple Access coding scheme index c based on the terminal device identifier n by using the following formula:

$$c = \mod(\lfloor n/K \rfloor, T) \quad \text{Formula 6, where}$$

T is a positive integer; and select a Code Division Multiple Access coding scheme from a Code Division Multiple Access coding scheme set based on the Code Division Multiple Access coding scheme index, where the Code Division Multiple Access coding scheme set includes T Code Division Multiple Access coding schemes.

Optionally, when obtaining the interleaving pattern by using Formulas 1 and 2 or by using Formulas 3 and 2, the terminal device may obtain the Code Division Multiple Access coding scheme index c by using Formula 6. Therefore, the Code Division Multiple Access coding scheme and the interleaving pattern are obtained based on the terminal device identifier n in this case, so as to implement correlation between the Code Division Multiple Access coding scheme and the interleaving pattern.

In an implementation, the terminal device obtains the Code Division Multiple Access coding scheme index c based on the cell identity N of the terminal device, the terminal device identifier n, and the frame number or timeslot number m by using the following formula:

$$c = \mod\left(\sum_{s=0}^{7} f_P(8m+s)2^s + n/K, T\right),\quad \text{Formula 7}$$

where

T is a positive integer.

Optionally, when obtaining the interleaving pattern by using Formulas 1 and 4 or by using Formulas 3 and 4, the terminal device may obtain the Code Division Multiple Access coding scheme index c by using Formula 7. Therefore, the Code Division Multiple Access coding scheme and the interleaving pattern are obtained based on the terminal device identifier n, the cell identity N, and the frame number or timeslot number m in this case, so as to implement correlation between the Code Division Multiple Access coding scheme and the interleaving pattern.

In an implementation, the terminal device obtains the Code Division Multiple Access coding scheme index c based on the cell identity N of the terminal device, the terminal device identifier n, the frame number or timeslot number m, and the subband number d by using the following formula:

$$c = \mod\left(\left(d2^8 + \sum_{s=0}^{7} f_P(8m+s)2^s + m\right)/K, T\right),\quad \text{Formula 8}$$

where

T is a positive integer, and $\lfloor\ \rfloor$ represents rounding down to a nearest integer. In addition, in this application file, calculation through rounding down to a nearest integer may be replaced with rounding up to a nearest integer, or calculation through rounding up to a nearest integer may be replaced with rounding down to a nearest integer. For brevity, details are not described herein.

Optionally, when obtaining the interleaving pattern by using Formulas 1 and 5 or by using Formulas 3 and 5, the terminal device may obtain the Code Division Multiple Access coding scheme index c by using Formula 8. Therefore, the Code Division Multiple Access coding scheme and the interleaving pattern are obtained based on the terminal device identifier n, the cell identity N, the frame number or timeslot number m, and the subband number d in this case, so as to implement correlation between the Code Division Multiple Access coding scheme and the interleaving pattern.

Optionally, in addition to the foregoing formulas for obtaining a Code Division Multiple Access coding scheme, another obtaining manner may also be used.

In an implementation, the Code Division Multiple Access coding scheme set may be determined from a plurality of prestored Code Division Multiple Access coding scheme sets based on at least one of the cell identity of the terminal device and the time-domain resource information. Specifically, a set index may be generated based on at least one of the cell identity of the terminal device and the time-domain resource information, so as to obtain the Code Division Multiple Access coding scheme set from the plurality of prestored Code Division Multiple Access coding scheme sets.

After the Code Division Multiple Access coding scheme set is obtained, the Code Division Multiple Access coding scheme is obtained from the obtained Code Division Multiple Access coding scheme set. For example, the Code Division Multiple Access coding scheme may be obtained from the obtained Code Division Multiple Access coding scheme set based on the terminal device identifier. Specifically, an element index may be generated based on the terminal device identifier, and the Code Division Multiple Access coding scheme may be obtained from the Code Division Multiple Access coding scheme set based on the element index.

Optionally, by using a same set index, the Code Division Multiple Access coding scheme set may be selected from the plurality of Code Division Multiple Access coding scheme sets, and the interleaving pattern set may be selected from the plurality of interleaving pattern sets.

Optionally, by using a same element index, the Code Division Multiple Access coding scheme may be selected from the Code Division Multiple Access coding scheme set, and the interleaving pattern may be selected from the interleaving pattern set.

In another implementation, a network device may send, to the terminal device, indication information that is used to indicate a Code Division Multiple Access coding scheme set. In this case, the terminal device may select a Code Division Multiple Access coding scheme from the Code Division Multiple Access coding scheme set indicated by the indication information.

The indication information may carry a set index of the Code Division Multiple Access coding scheme set. The Code Division Multiple Access coding scheme set is determined from a plurality of prestored Code Division Multiple Access coding scheme sets based on the set index carried in the indication information. Alternatively, the indication information may directly carry the Code Division Multiple Access coding scheme set. To be specific, the indication information may carry elements included in the Code Division Multiple Access coding scheme set.

230: The terminal device performs interleaving processing on data by using the obtained interleaving pattern.

Optionally, 240: If the terminal device has obtained the Code Division Multiple Access coding scheme, the terminal device may perform Code Division Multiple Access encoding on the data by using the Code Division Multiple Access coding scheme.

Interleaving processing may be performed on the data before Code Division Multiple Access encoding, or interleaving processing may be performed on the data after Code Division Multiple Access encoding.

250: The terminal device sends processed data, and optionally sends the processed data to a network device.

Optionally, in this embodiment of this application, the terminal device may select a time-frequency resource from a time-frequency resource set, and send the data obtained through interleaving processing and Code Division Multiple Access encoding; or may send, by using a fixed time-frequency resource scheduled by the network device, the data obtained through interleaving processing and Code Division Multiple Access encoding.

In this embodiment of this application, a basic transmission unit may be a TTI. There may be a plurality of time-frequency resource blocks in one TTI that are used for grant-free transmission. Each time-frequency resource block usually includes several consecutively or discretely distributed physical resource blocks (Physical Resource Block, PRB). The time-frequency resource set may include a plurality of time-frequency resource blocks.

260: The network device receives the processed data sent by the terminal device, and deinterleaves the data based on the interleaving pattern in an interleaving pattern set.

Optionally, if the terminal device performs Code Division Multiple Access encoding on the data by using the Code Division Multiple Access coding scheme, the network device performs Code Division Multiple Access decoding on the data in 265.

Optionally, the method further includes 270 and 275.

270: The terminal device selects a pilot sequence from a pilot sequence set, and sends the pilot sequence.

Optionally, the pilot sequence may be selected from the pilot sequence set based on a pilot index.

Optionally, the terminal device may generate the pilot index based on at least one of the cell identity of the terminal device, the terminal device identifier, and the time-domain resource information by using a formula, and obtain the pilot sequence from the pilot sequence set based on the pilot index.

The following describes several implementations of obtaining a pilot index by using a formula.

In an implementation, the terminal device may obtain the pilot index b based on the terminal device identifier n by using the following formula:

$$b = \mod(n, KT) \quad \text{Formula 9}$$

Optionally, when obtaining the Code Division Multiple Access coding scheme index by using Formulas 1 and 2 and/or by using Formula 6, the terminal device may obtain the pilot index by using Formula 9.

Optionally, when obtaining the Code Division Multiple Access coding scheme index by using Formulas 3 and 2 and/or by using Formula 6, the terminal device may obtain the pilot index by using Formula 9.

In this case, the Code Division Multiple Access coding scheme, the interleaving pattern, and the pilot index may be obtained based on the terminal device identifier n, so as to implement correlation between the Code Division Multiple Access coding scheme, the interleaving pattern, and the pilot index. In addition, it can be learned from the foregoing that the terminal may generate K interleaving patterns, the Code Division Multiple Access coding scheme set includes T Code Division Multiple Access coding schemes, and the pilot sequence set includes KT pilot sequences. This can implement that a quantity of pilot sequences is equal to a quantity of interleaving patterns multiplied by a quantity of Code Division Multiple Access coding schemes, so as to better distinguish between terminal devices during grant-free transmission.

In another implementation, the terminal device may obtain the pilot index based on the cell identity N of the terminal device, the terminal device identifier n, and the frame number or timeslot number m by using the following formula:

$$b = \mod\left(\sum_{s=0}^{7} f_P(8m+s)2^s + n, KT\right) \quad \text{Formula 10}$$

Optionally, when obtaining the Code Division Multiple Access coding scheme index by using Formulas 1 and 4 and/or by using Formula 7, the terminal device may obtain the pilot index by using Formula 10.

Optionally, when obtaining the Code Division Multiple Access coding scheme index by using Formulas 3 and 4 and/or by using Formula 7, the terminal device may obtain the pilot index by using Formula 10.

In this case, the Code Division Multiple Access coding scheme, the interleaving pattern, and the pilot index may be obtained based on the terminal device identifier n, the cell identity N, and the timeslot number or frame number m, so as to implement correlation between the Code Division Multiple Access coding scheme, the interleaving pattern, and the pilot index. In addition, it can be learned from the foregoing that the terminal may generate K interleaving patterns, the Code Division Multiple Access coding scheme set includes T Code Division Multiple Access coding schemes, and the pilot sequence set includes KT pilot sequences. This can implement that a quantity of pilot sequences is equal to a quantity of interleaving patterns multiplied by a quantity of Code Division Multiple Access coding schemes, so as to better distinguish between terminal devices during grant-free transmission.

In another implementation, the terminal device may obtain the pilot index based on the cell identity N of the terminal device, the terminal device identifier n, the frame number or timeslot number m, and the subband number d by using the following formula:

$$b = \mod\left(d2^8 + \sum_{s=0}^{7} f_P(8m+s)2^s + n, KT\right) \quad \text{Formula 11}$$

Optionally, when obtaining the Code Division Multiple Access coding scheme index by using Formulas 1 and 5 and/or by using Formula 8, the terminal device may obtain the pilot index by using Formula 11.

Optionally, when obtaining the Code Division Multiple Access coding scheme index by using Formulas 3 and 5 and/or by using Formula 8, the terminal device may obtain the pilot index by using Formula 11.

In this case, the Code Division Multiple Access coding scheme, the interleaving pattern, and the pilot index may be obtained based on the terminal device identifier n, the cell identity N, and the timeslot number or frame number m, so as to implement correlation between the Code Division Multiple Access coding scheme, the interleaving pattern, and the pilot index. In addition, it can be learned from the foregoing that the terminal may generate K interleaving patterns, the Code Division Multiple Access coding scheme set includes T Code Division Multiple Access coding schemes, and the pilot sequence set includes KT pilot sequences. This can implement that a quantity of pilot sequences is equal to a quantity of interleaving patterns multiplied by a quantity of Code Division Multiple Access coding schemes, so as to better distinguish between terminal devices during grant-free transmission.

Optionally, in addition to the foregoing formulas for obtaining a pilot, another obtaining manner may also be used.

For example, a pilot set may be determined from a plurality of prestored pilot sets based on at least one of the cell identity of the terminal device and the time-domain resource information. Specifically, a set index may be generated based on at least one of the cell identity of the terminal device and the time-domain resource information, so as to obtain the pilot set from the plurality of prestored pilot sets.

After obtaining the pilot set, the pilot may be obtained from the obtained pilot set. For example, the pilot may be obtained from the determined pilot set based on the terminal device identifier. Specifically, an element index may be generated based on the terminal device identifier, and the pilot may be obtained from the pilot set based on the element index.

Optionally, in this embodiment of this application, by using an index, the pilot sequence may be selected from the pilot sequence set, and/or the interleaving pattern may be selected from the interleaving pattern set, and/or the Code Division Multiple Access coding scheme may be selected from the Code Division Multiple Access coding scheme set.

In this embodiment of this application, if corresponding elements need to be selected separately from different sets by using a same index. For example, by using an index k, a Code Division Multiple Access coding scheme set is selected from a Code Division Multiple Access coding scheme set, and an interleaving pattern is selected from an interleaving pattern set. If a value of k is greater than a quantity T of elements included in a set, when an element is being selected from the set, the index may be processed first. For example, a processed index may be obtained based on a function mod(k,T); and a corresponding element is selected from the set by using the processed index, where mod represents modulo processing.

In this embodiment of this application, the pilot sequence set includes all pilot sequences used for grant-free access, and the pilot sequence includes an uplink demodulation reference signal sequence or another reference signal sequence. In this embodiment of this application, a pilot sequence same as that in a prior-art system may be used, or a quantity of pilot sequences may be increased by using another method.

275: The network device obtains the pilot sequence.

Figure 3:
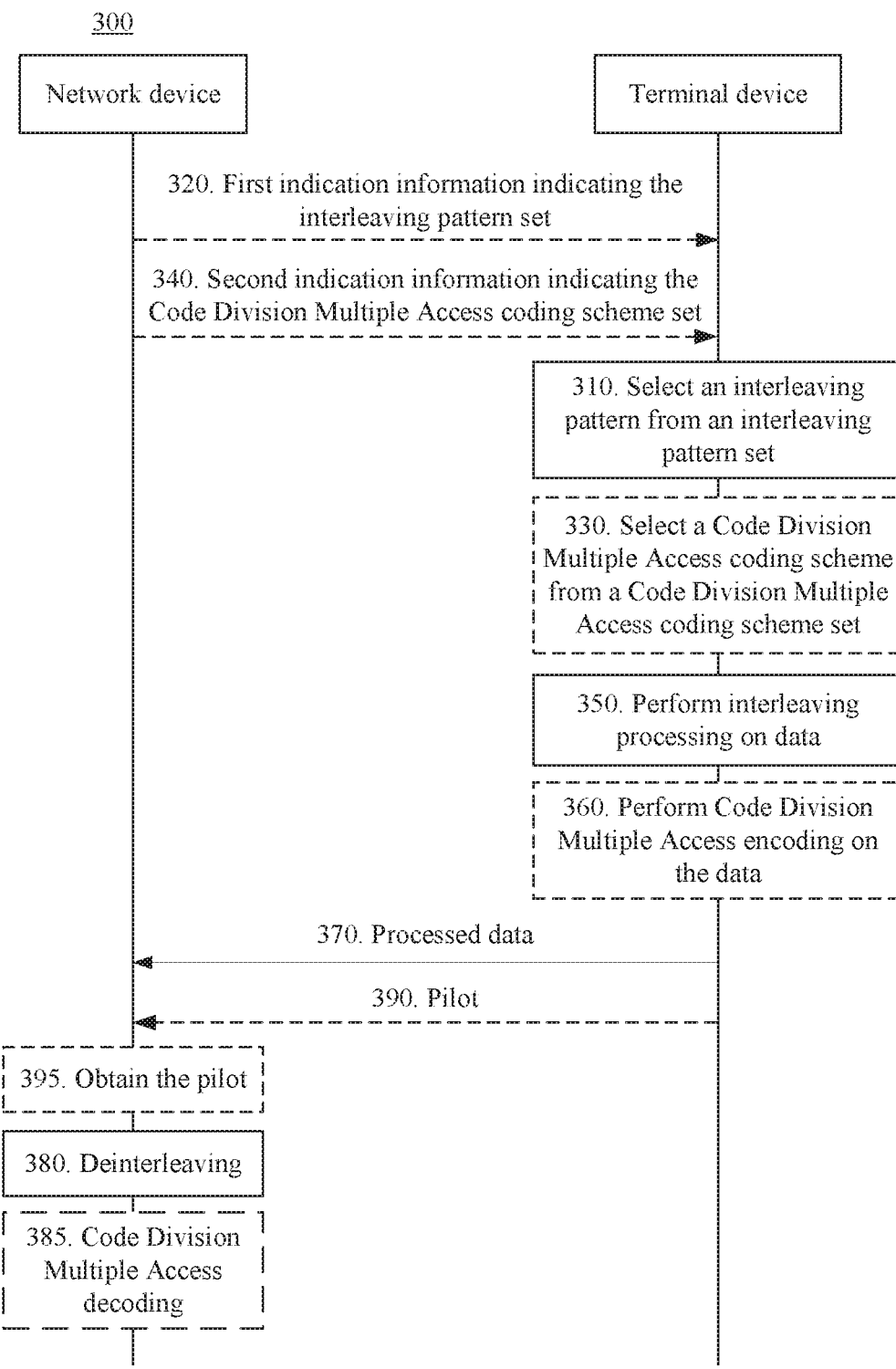
FIG. 3 is a schematic flowchart of a grant-free transmission method according to an embodiment of this application.

FIG. 3 is a schematic flowchart of a grant-free transmission method 300 according to an embodiment of this application.

310: A terminal device obtains an interleaving pattern from an interleaving pattern set.

Optionally, as shown in FIG. 3, in 320, a network device sends first indication information, and optionally sends the first indication information to the terminal device; and the terminal device correspondingly performs receiving, where the first indication information is used to indicate one or more interleaving pattern sets. The terminal device may obtain the interleaving pattern from the interleaving pattern set indicated by the first indication information.

The first indication information may carry a set index of the interleaving pattern set. The interleaving pattern set is determined from a plurality of prestored interleaving pattern sets based on the set index carried in the first indication information. Alternatively, the first indication information may directly carry the interleaving pattern set. To be specific, the indication information may be used to inform the terminal device of an element in the interleaving pattern set.

Optionally, the terminal device may determine the interleaving pattern set based on at least one of a cell identity of the terminal device and time-domain resource information. For example, the terminal device may generate a set index based on at least one of the cell identity of the terminal device and the time-domain resource information; and determine the interleaving pattern set from a plurality of prestored interleaving pattern sets based on the set index.

After the interleaving pattern set is determined, the interleaving pattern may be obtained from the interleaving pattern set. The interleaving pattern may be randomly selected from the interleaving pattern set; or an element index may be generated based on a terminal device identifier, and the interleaving pattern may be determined from the selected interleaving pattern set based on the element index.

Optionally, the method 300 further includes 330. In 330, the terminal device obtains a Code Division Multiple Access coding scheme from a Code Division Multiple Access coding scheme set.

Optionally, as shown in FIG. 3, in 340, the network device may send second indication information, and optionally sends the second indication information to the terminal device; and the terminal device correspondingly performs receiving. The second indication information is used to indicate the Code Division Multiple Access coding scheme set. The terminal device may obtain the Code Division Multiple Access coding scheme from the Code Division Multiple Access coding scheme set indicated by the second indication information.

Optionally, the second indication information may carry a set index of the Code Division Multiple Access coding scheme set. The Code Division Multiple Access coding scheme set is determined from a plurality of prestored Code Division Multiple Access coding scheme sets based on the set index carried in the second indication information. Alternatively, the second indication information may directly carry the Code Division Multiple Access coding scheme set. To be specific, the indication information may include elements in the Code Division Multiple Access coding scheme set.

Optionally, another method for obtaining a Code Division Multiple Access coding scheme set may be: determining, by the terminal device, the Code Division Multiple Access coding scheme set based on at least one of the cell identity of the terminal device and the time-domain resource information. For example, the terminal device may generate a set index based on at least one of the cell identity of the terminal device and time-domain resource information; and determine the Code Division Multiple Access coding scheme set from the plurality of prestored Code Division Multiple Access coding scheme sets based on the set index.

After the Code Division Multiple Access coding scheme set is determined, the Code Division Multiple Access coding scheme may be obtained from the Code Division Multiple Access coding scheme set. The Code Division Multiple Access coding scheme may be randomly selected from the Code Division Multiple Access coding scheme set; or an index may be generated based on the terminal device identifier, and the Code Division Multiple Access coding scheme may be determined from the determined Code Division Multiple Access coding scheme set based on the index.

Optionally, by using a same set index, the interleaving pattern set may be selected from the plurality of interleaving pattern sets, and the Code Division Multiple Access coding scheme set may be selected from the plurality of Code Division Multiple Access coding scheme sets.

Optionally, by using a same element index, the interleaving pattern may be selected from the interleaving pattern set, and the Code Division Multiple Access coding scheme may be selected from the Code Division Multiple Access coding scheme set.

Optionally, the first indication information and the second indication information may be carried in a same field of one message. For example, if an index indicated by a field of a message is used to obtain both the interleaving pattern set and the Code Division Multiples Access coding scheme set, it may be understood that the first indication information is the second indication information in this case. Alternatively, the first indication information and the second indication information may be carried in different fields of one message, or the first indication information and the second indication information are carried in different messages.

Optionally, in this embodiment of this application, there may be no Code Division Multiple Access coding scheme set, that is, the terminal device has a unique fixed Code Division Multiple Access coding scheme.

350: The terminal device performs interleaving processing on data by using the interleaving pattern selected from the interleaving pattern set.

Optionally, in 360, if the terminal device has selected the Code Division Multiple Access coding scheme from the Code Division Multiple Access coding scheme set, the terminal device may perform Code Division Multiple Access encoding on the data by using the Code Division Multiple Access coding scheme selected from the Code Division Multiple Access coding scheme set.

Interleaving processing may be performed on the data before Code Division Multiple Access encoding, or interleaving processing may be performed on the data after Code Division Multiple Access encoding.

370: The terminal device sends processed data, and optionally sends the processed data to the network device.

Optionally, in this embodiment of this application, the terminal device may select a time-frequency resource from a time-frequency resource set, and send the data obtained through interleaving processing and Code Division Multiple Access encoding processing; or may send, by using a fixed time-frequency resource scheduled by the network device, the data obtained through interleaving processing and Code Division Multiple Access encoding processing.

380: The network device receives the processed data sent by the terminal device, and deinterleaves the data based on the interleaving pattern in the interleaving pattern set.

Optionally, if the terminal device performs Code Division Multiple Access encoding on the data by using the Code Division Multiple Access coding scheme in the Code Division Multiple Access coding scheme set, the network device performs Code Division Multiple Access decoding on the data by using the Code Division Multiple Access coding scheme in the Code Division Multiple Access coding scheme set in 385.

Optionally, the method further includes 390 and 395.

390: The terminal device selects a pilot sequence from a pilot sequence set, and sends the pilot sequence.

Optionally, the pilot sequence may be selected from the pilot sequence set based on a pilot index.

Optionally, in this embodiment of this application, by using an index, the pilot sequence may be selected from the pilot sequence set, and/or the interleaving pattern may be selected from the interleaving pattern set, and/or the Code Division Multiple Access coding scheme may be selected from the Code Division Multiple Access coding scheme set.

In this embodiment of this application, the pilot sequence set may include pilot sequences used for grant-free access, and the pilot sequence may include an uplink demodulation reference signal sequence or another reference signal sequence. In this embodiment of this application, a pilot sequence same as that in a prior-art system may be used, or a quantity of pilot sequences may be increased by using another method.

395: The network device obtains the pilot sequence.

A plurality of manners of obtaining an interleaving pattern, a Code Division Multiple Access coding scheme, and a pilot are described with reference to the foregoing grant-free transmission methods in the embodiments of this application described in FIG. 2 and FIG. 3, but this application is not limited thereto.

Figure 4:
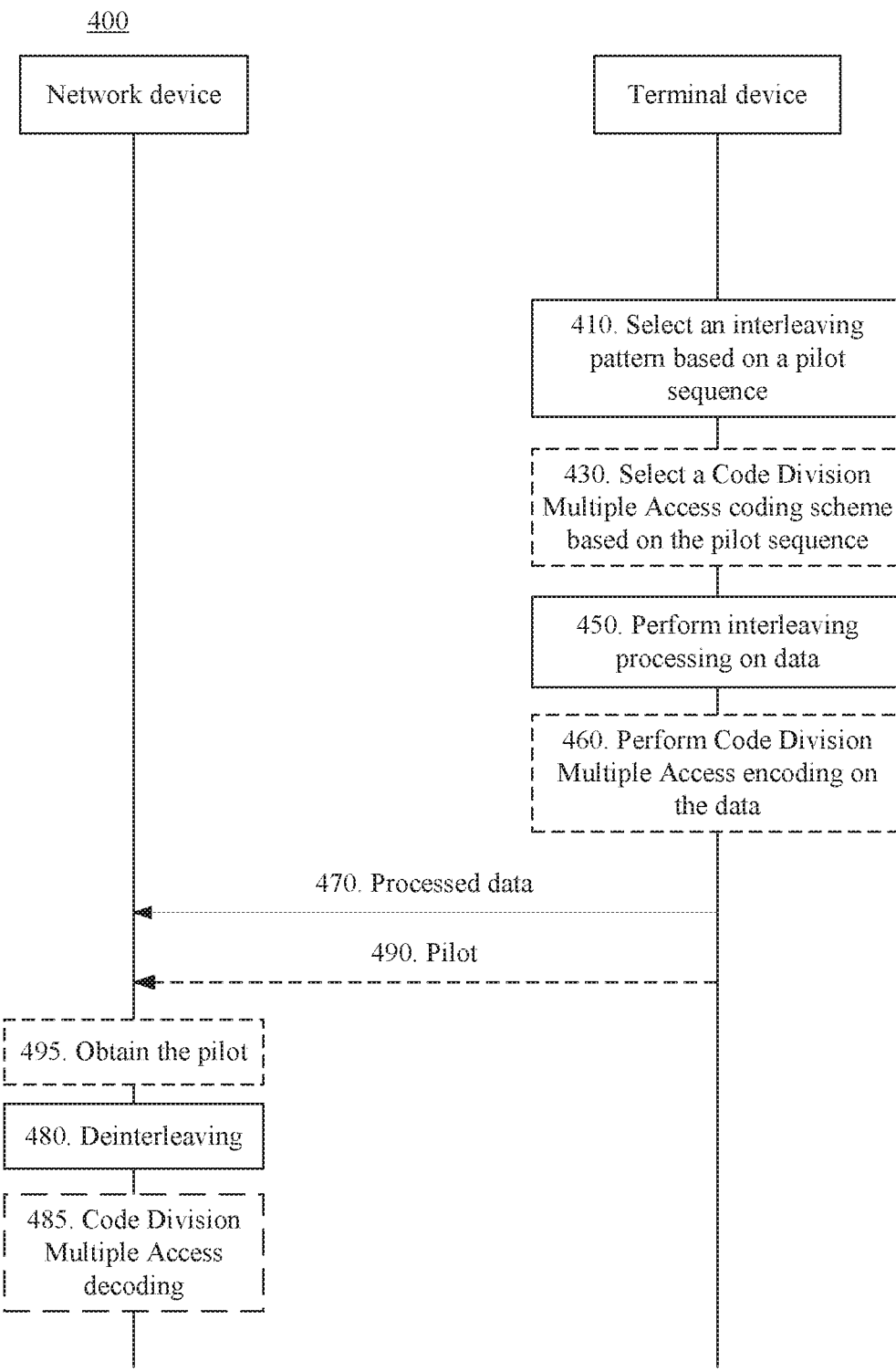
FIG. 4 is a schematic flowchart of a grant-free transmission method according to an embodiment of this application.

As shown in FIG. 4, the terminal device may prestore a correspondence between a pilot sequence and an interleaving pattern, for example, a correspondence between a pilot sequence and an interleaving pattern listed in Table 4. For example, in 410, after determining a pilot sequence, the terminal device may obtain an interleaving pattern based on the correspondence. Alternatively, after determining an interleaving pattern, the terminal device may obtain a pilot sequence based on the correspondence.

TABLE 4

| Interleaving pattern | $\Pi_1$ | $\Pi_2$ | $\Pi_3$ | $\Pi_4$ | $\Pi_5$ | $\Pi_6$ | ... |
|---|---|---|---|---|---|---|---|
| Pilot sequence | $P_{11}$ | $P_{21}$ | $P_{31}$ | $P_{41}$ | $P_{51}$ | $P_{61}$ | ... |
| Pilot sequence | $P_{12}$ | $P_{22}$ | $P_{32}$ | $P_{42}$ | $P_{52}$ | $P_{62}$ | ... |
| ... | ... | ... | ... | ... | ... | ... | ... |
| Pilot sequence | $P_{1k}$ | $P_{2k}$ | $P_{3k}$ | $P_{4k}$ | $P_{5k}$ | $P_{6k}$ | ... |

In Table 4, each interleaving pattern may be corresponding to k pilot sequences, and each interleaving pattern is corresponding to a different pilot sequence. $\Pi_i$ represents an interleaving pattern, and different values of i represent corresponding different interleaving patterns; $P_{ij}$ represents a pilot sequence, and different values of i and j represent corresponding different pilot sequences.

Similarly, the terminal device may prestore a correspondence, similar to that in Table 4, between a Code Division Multiple Access coding scheme and a pilot sequence. Therefore, after determining the pilot sequence, the terminal device may obtain a corresponding Code Division Multiple Access coding scheme (for example, 430 shown in FIG. 4) based on the correspondence between a Code Division Multiple Access coding scheme and a pilot sequence. Alternatively, after determining the Code Division Multiple Access coding scheme, the terminal device may obtain a corresponding pilot sequence based on the correspondence between a Code Division Multiple Access coding scheme and a pilot sequence. Alternatively, after obtaining the pilot sequence, the terminal device may query Table 4 for an interleaving pattern corresponding to the pilot sequence, and may further optionally select a Code Division Multiple Access coding scheme from a Code Division Multiple Access coding scheme set based on the correspondence between a Code Division Multiple Access coding scheme and a pilot sequence.

For details of processing steps 450 to 495 in FIG. 4, reference may be made to the descriptions in the embodiments in FIG. 2 and FIG. 3.

Therefore, in this embodiment of this application, during grant-free transmission, interleaving processing is performed on the data by using the interleaving pattern. This can avoid a data decoding failure caused by a failure in distinguishing between a plurality of terminals when the terminals select another same transmission resource, thereby improving grant-free transmission reliability. In addition, interleaving processing can randomize inter-user interference, so as to improve link performance. Further, the Code Division Multiple Access coding scheme is selected from a plurality of Code Division Multiple Access coding schemes, and is used for Code Division Multiple Access encoding processing on the data. This can further avoid a data decoding failure caused by a failure in distinguishing between a plurality of terminals when the terminals select another same transmission resource, thereby further improving grant-free transmission reliability.

It should be understood that sequence numbers of the processes do not mean execution sequences in various embodiments of this application. The execution sequences of the processes should be determined based on functions and internal logic of the processes, and should not constitute any limitation on the implementation processes of the embodiments of this application.

It should be understood that the grant-free transmission method in this embodiment of this application may not be limited to the operations shown in FIG. 2 or FIG. 3. For example, the grant-free transmission method in this embodiment of this application may further include channel encoding performed on data.

Optionally, in this embodiment of this application, interleaving processing on the data may be performed before Code Division Multiple Access encoding and after channel encoding processing; may be performed after channel encoding processing and Code Division Multiple Access encoding; or may be performed before channel encoding processing and Code Division Multiple Access encoding.

Figure 5:
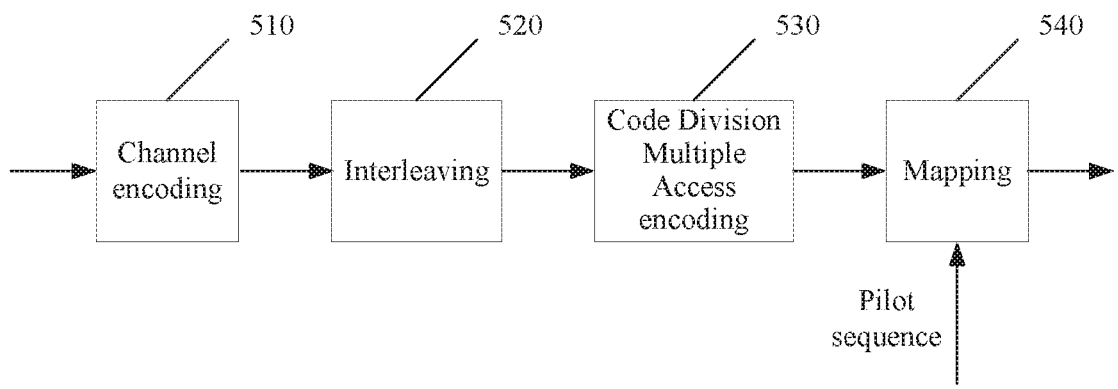
FIG. 5 is a schematic flowchart of a grant-free transmission method according to an embodiment of this application.

For ease of understanding, with reference to FIG. 5, the following describes a grant-free transmission method in this application by using an example that interleaving is performed before Code Division Multiple Access encoding and after channel encoding processing.

510: Channel encoding is performed on an information bit, to obtain channel-encoded data; in 520, interleaving processing is performed, by using an interleaving pattern, on the channel-encoded data, to obtain interleaved user data; in 530, Code Division Multiple Access encoding is performed on the interleaved user data; and in 540, data obtained through Code Division Multiple Access encoding and a pilot sequence are mapped to a selected time-frequency resource and then sent to a network device.

In this embodiment of this application, channel encoding may be, for example. Turbo coding and tail-biting convolutional coding in an LTE system. Different code rates and coding schemes may be selected depending on different user QoS requirements, to perform channel encoding. In grant-free transmission, a same coding scheme and a same code rate may be used for a type of service.

Optionally, the Code Division Multiple Access coding scheme described in this embodiment of this application may be a Code Domain Multiple Access manner, and Code Division Multiple Access encoding may be performed by using a ZC code, a PN code, a sparse codebook (such as an SCMA codebook), or another code.

Optionally, when the Code Division Multiple Access coding scheme is corresponding to the ZC code or the PN code, QAM modulation may be first performed on data, and then Code Division Multiple Access encoding (may also be referred to as spreading) may be performed on an obtained modulation symbol. To be specific, the modulation symbol is multiplied by the selected ZC code or PN code, to obtain a multidimensional modulation symbol.

Figure 6:
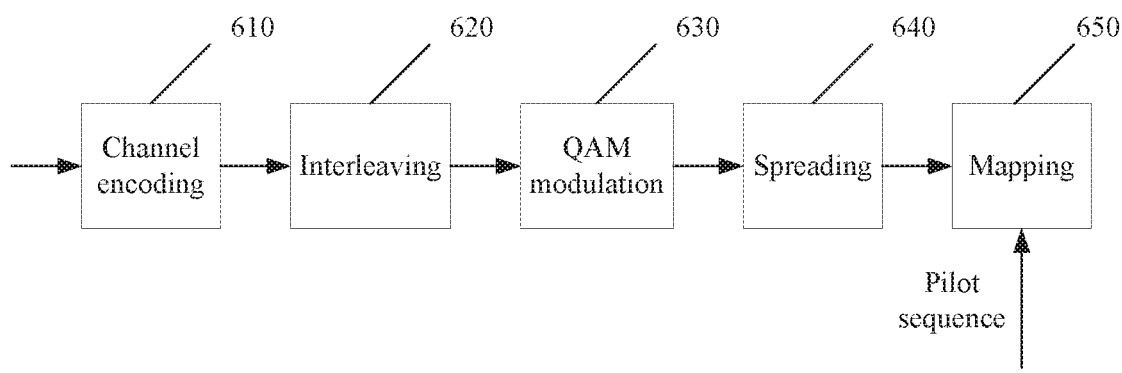
FIG. 6 is a schematic flowchart of a grant-free transmission method according to an embodiment of this application.

For example, according to a grant-free transmission method 600 shown in FIG. 6, in 610, channel encoding is performed on an information bit, to obtain channel-encoded user data; in 620, interleaving processing is performed on the channel-encoded data by using an interleaving pattern, to obtain interleaved user data; in 630, QAM modulation is performed on the interleaved user data, to obtain a modulation symbol; in 640, the modulation symbol is multiplied by a spreading code (such as a ZC code or a PN code), to obtain a multidimensional modulation symbol; and in 650, the multidimensional modulation symbol and a pilot sequence are mapped to a selected time-frequency resource, and then sent to the network device.

Optionally, when the Code Division Multiple Access coding scheme is corresponding to the sparse codebook, Code Division Multiple Access encoding may be considered as a codebook mapping process, that is, a bit may be directly mapped to a multidimensional modulation symbol.

Figure 7:
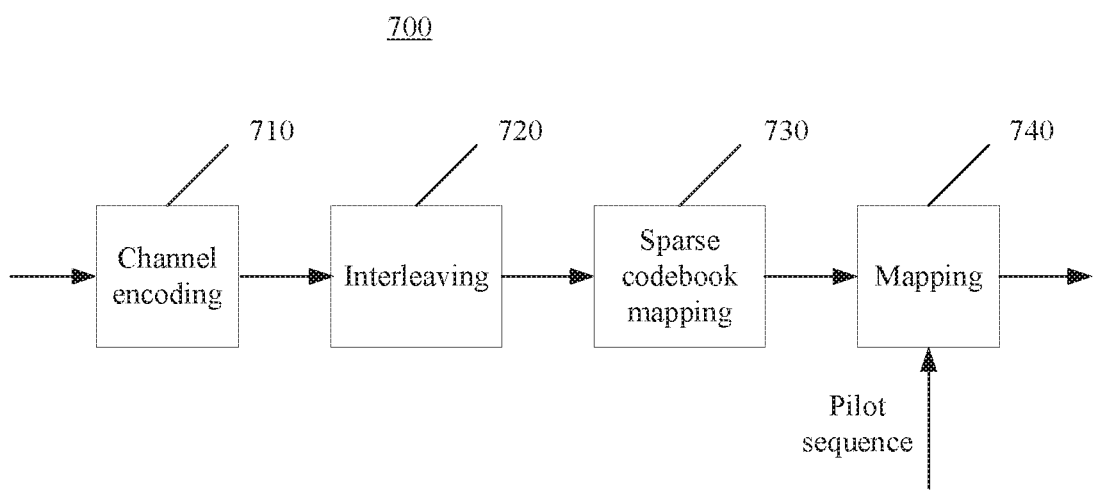
FIG. 7 is a schematic flowchart of a grant-free transmission method according to an embodiment of this application.

For example, according to a grant-free transmission method 700 shown in FIG. 7, in 710, channel encoding is performed on an information bit, to obtain channel-encoded user data; in 720, interleaving processing is performed on the channel-encoded data by using an interleaving pattern, to obtain interleaved user data; in 730, sparse codebook mapping is performed on the interleaved user data, to obtain a multidimensional modulation symbol; and in 740, the multidimensional modulation symbol and a pilot sequence are mapped to a selected time-frequency resource, and then sent to the network device.

It should be understood that in this embodiment of this application, the sparse codebook may be an SCMA codebook.

Optionally, the Sparse Code Multiple Access (SCMA, Sparse Code Multiple Access) codebook includes at least two codewords. The SCMA codebook is used to indicate a mapping relationship between at least two data combinations and the at least two codewords. The codeword is a multi-dimensional complex-number vector and is used to indicate a mapping relationship between data and a plurality of modulation symbols. The mapping relationship may be a direct mapping relationship, and the modulation symbol includes at least one zero modulation symbol and at least one non-zero modulation symbol.

Specifically, SCMA is a non-orthogonal multiple access technology. Certainly, a person skilled in the art may not use SCMA as a name of the technology, but may use another technical name. In the technology, a plurality of different data streams are transmitted on a same transmission resource by using a codebook, and different codebooks are used for different data streams. Therefore, resource utilization is improved. The data streams may be from a same terminal device or may be from different terminal devices.

A codebook used in SCMA is a set of at least two codewords.

A codeword used in SCMA may have sparsity to some extent. For example, a quantity of zero elements in the codeword may be not less than that of modulation symbols, so that a receive end can use a multi-user detection technology to perform decoding with relatively low complexity. Herein, the foregoing relationship between the quantity of zero elements and the quantity of modulation symbols is merely an example description of sparsity. This application is not limited thereto. A ratio of the quantity of zero elements to a quantity of non-zero elements may be randomly set depending on a requirement.

Certainly, the Code Division Multiple Access coding scheme in this embodiment of this application may be alternatively corresponding to a multi-user shared access (multi-user shared access, MUSA) code or another sparse spreading code. The MUSA code may support grant-free transmission and high user load by using a random non-orthogonal complex spreading code.

It should be understood that the grant-free transmission methods shown in FIG. 5 to FIG. 7 are merely optional implementations in the embodiments of this application. There may be another implementation in the embodiments of this application.

Figure 8:
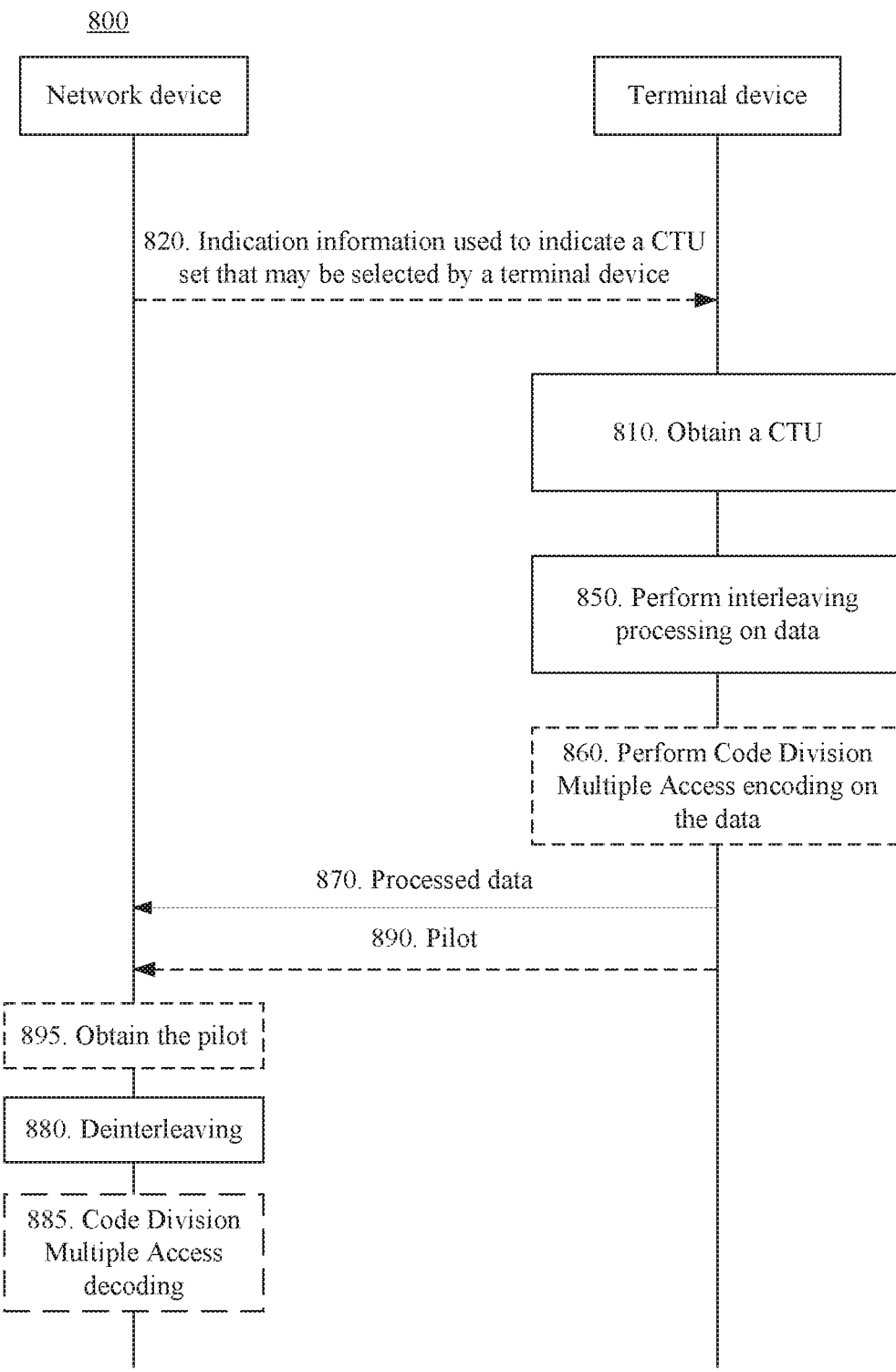
FIG. 8 is a schematic flowchart of a grant-free transmission method according to an embodiment of this application.

In an embodiment shown in FIG. 8, operations in 210 and 220 shown in FIG. 2 may be replaced with 810: The terminal device obtains a CTU; or operations in 310 and 330 shown in FIG. 3 may be replaced with 810: The terminal device obtains a CTU; and the indication information in 320 and 340 may be replaced with the indication information, in 820, used to indicate a CTU set that may be selected by the terminal device. The CTU includes an interleaving pattern. In this case, the terminal device may interleave data based on the interleaving pattern included in the CTU.

Optionally, the CTU further includes a Code Division Multiple Access coding scheme, a pilot sequence, and a time-frequency resource. The terminal device performs Code Division Multiple Access encoding processing on the data based on the Code Division Multiple Access coding scheme; and sends processed data and the pilot sequence by using the time-frequency resource.

Optionally, the network device may broadcast a plurality of selectable CTUs. Each CTU includes a Code Division Multiple Access coding scheme, a pilot sequence, a time-frequency resource, and an interleaving pattern. At least one dimension may be different between different CTUs, for example, interleaving patterns are different. Therefore, using different interleaving patterns can avoid a data decoding failure caused by a failure in distinguishing between a plurality of terminals when the terminals select a same time-frequency resource.

Optionally, the terminal device may select a CTU from a plurality of CTUs based on an index. Optionally, the index may be generated by a random number generator. An initial value of the random number generator is at least one of a terminal device identifier, a system frame number, a timeslot number, and a cell identity. The system frame number and the timeslot number may be a frame number of a current frame and a number of a current timeslot that are used to send data, and the cell identity may be an identity of a cell in which the terminal device is located.

Optionally, in this embodiment of this application, a CTU and an element set (for example, a Code Division Multiple Access coding scheme set or an interleaving pattern set) may coexist. For example, the CTU includes a Code Division Multiple Access coding scheme, a time-domain resource, and a frequency-domain resource, and an interleaving pattern may be selected from the interleaving pattern set.

Optionally, when the CTU and the element set coexist, CTU selection and element selection from the element set may be performed by using a same index, or CTU selection and element selection from the element set may be performed by using different indexes.

For details of processing steps 850 to 895 in FIG. 8, reference may be made to the descriptions in the embodiments in FIG. 2 and FIG. 3.

Figure 9:
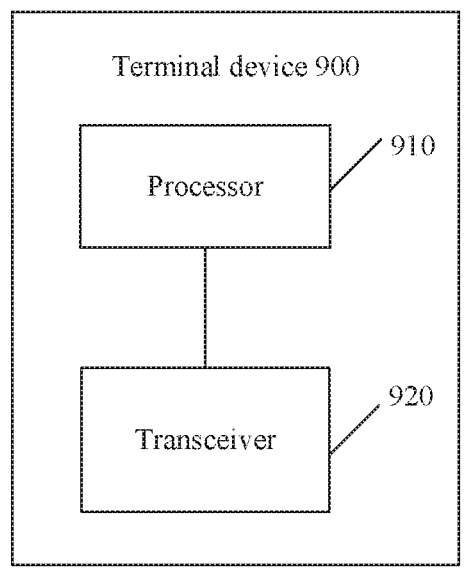
FIG. 9 is a schematic block diagram of a terminal device according to an embodiment of this application.

FIG. 9 is a schematic block diagram of a terminal device 900 according to an embodiment of this application. As shown in FIG. 9, the terminal device 900 includes a processor 910 and a transceiver 920.

It should be understood that the terminal device 900 may be corresponding to the terminal devices in the foregoing method embodiments, and may have any function of the terminal devices in the methods. For brevity, some functions of the terminal device shown in FIG. 2 are merely used as an example herein to describe the terminal device 900, but this embodiment is not limited thereto.

The processor 910 is configured to: obtain an interleaving pattern based on at least one of a cell identity of the terminal device, a terminal device identifier, time-domain resource information, and frequency-domain resource information; and interleave data based on the obtained interleaving pattern, to obtain interleaved data.

The transceiver 920 is configured to send the interleaved data.

Optionally, the processor 910 is specifically configured to: obtain the interleaving pattern based on at least one of the cell identity of the terminal device, the terminal device identifier, the time-domain resource information, and the frequency-domain resource information by using a formula.

Optionally, the processor 910 is specifically configured to: obtain the interleaving pattern based on the terminal device identifier n by using the following formulas:

$$\pi_i(j) = \mathrm{mod}(\pi(j)+a, K), 0=1, \ldots, K-1, \text{ and}$$

$$a = \mathrm{mod}(n, K), \text{ where}$$

π(j) is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to π(j); n is the terminal device identifier; the base interleaving matrix includes K columns, where K is a positive integer; and mod represents modulo processing.

Optionally, the processor 910 is specifically configured to obtain the interleaving pattern based on the terminal device identifier n by using the following formulas:

$$\pi_i(x) = \mathrm{mod}(a + f_1 x + f_2 x^2, K), x=0, \ldots, K-1, \text{ and}$$

$$a = \mathrm{mod}(n, K), \text{ where}$$

K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

Optionally, the processor 910 is further configured to:
obtain a Code Division Multiple Access coding scheme index c based on the terminal device identifier n by using the following formula:

$$c = \mathrm{mod}(\lfloor n/K \rfloor, T), \text{ where}$$

T is a positive integer, and ⌊ ⌋ represents rounding down to a nearest integer:
select a Code Division Multiple Access coding scheme from a Code Division Multiple Access coding scheme set based on the Code Division Multiple Access coding scheme index, where the Code Division Multiple Access coding scheme set includes T Code Division Multiple Access coding schemes; and perform Code Division Multiple Access encoding on the data based on the selected Code Division Multiple Access coding scheme; and the transceiver 920 is specifically configured to send data obtained through interleaving and Code Division Multiple Access encoding.

Optionally, the processor 910 is further configured to:

obtain a pilot index b based on the terminal device identifier n by using the following formula:

$b = \mod(n, KT)$, where

T is a positive integer; and obtain a pilot sequence from a pilot sequence set based on the pilot index b, where the pilot sequence set includes KT pilot sequences; and the transceiver 920 is further configured to send the obtained pilot sequence.

Optionally, the processor 910 is specifically configured to:

obtain the interleaving pattern based on the cell identity N of the terminal device, the terminal device identifier n, and a frame number or timeslot number m by using the following formulas:

$\pi_i(j) = \mod(\pi(j) + a, K), 0 = 1, \ldots, K-1$, and $a = \mod\left(\sum_{s=0}^{7} f_P(8m + s)2^s + n, K\right)$, where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix includes K columns, where K is a positive integer; and mod represents modulo processing.

Optionally, the processor 910 is specifically configured to:

obtain the interleaving pattern based on the cell identity N of the terminal device, the terminal device identifier n, and a frame number or timeslot number in by using the following formulas:

$\pi_i(x) = \mod(a + f_1 x + f_2 x^2, K), x = 0, \ldots, K-1$, and $a = \mod\left(\sum_{s=0}^{7} f_P(8m + s)2^s + n, K\right)$, where $f_p(.)$ is generated by using a pseudo random sequence, and an initial value $c_{init}$ is N; K is a size of a to-be-transmitted bit block, where K is a positive integer; values of $f_1$ and $f_2$ are related to K; a represents a quantity of times that cyclic shift is performed on an input bit; x represents a sequence number of the input bit;

and $\pi_i(x)$ represents a sequence number for outputting an interleaved input bit.

Optionally, the processor 910 is further configured to:

obtain a Code Division Multiple Access coding scheme index c based on the cell identity N of the terminal device, the terminal device identifier n, and the frame number or timeslot number m by using the following formula:

$c = \mod\left(\sum_{s=0}^{7} f_P(8m + s)2^s + n, /K, T\right)$, where

T is a positive integer, and $\lfloor \ \rfloor$ represents rounding down to a nearest integer;

select a Code Division Multiple Access coding scheme from a Code Division Multiple Access coding scheme set based on the Code Division Multiple Access coding scheme index, where the Code Division Multiple Access coding scheme set includes T Code Division Multiple Access coding schemes; and perform Code Division Multiple Access encoding on the data based on the selected Code Division Multiple Access coding scheme; and the transceiver 920 is specifically configured to send data obtained through interleaving and Code Division Multiple Access encoding.

Optionally, the processor 910 is further configured to:

obtain a pilot index based on the cell identity N of the terminal device, the terminal device identifier n, and the frame number or timeslot number m by using the following formula:

$b = \mod\left(\sum_{s=0}^{7} f_P(8m + s)2^s + n, KT\right)$;

and obtain a pilot sequence from a pilot sequence set based on the pilot index b, where the pilot sequence set includes KT pilot sequences, and K is a positive integer; and the transceiver 920 is further configured to send the obtained pilot sequence.

Optionally, the processor 910 is further configured to:

generate the pilot index based on at least one of the cell identity of the terminal device, the terminal device identifier, the time-domain resource information, and the frequency-domain resource information by using a formula; and select the pilot sequence from the pilot sequence set based on the generated pilot index; and the transceiver 920 is further configured to send the selected pilot sequence.

Optionally, the processor 910 is further configured to:

generate the Code Division Multiple Access coding scheme index based on at least one of the cell identity of the terminal device, the terminal device identifier, the time-domain resource information, and the frequency-domain resource information by using a formula;

select the Code Division Multiple Access coding scheme from the Code Division Multiple Access coding scheme set based on the generated Code Division Multiple Access coding scheme index; and perform Code Division Multiple Access encoding on the data based on the selected Code Division Multiple Access coding scheme; and the transceiver 920 is further configured to:

send data obtained through interleaving and Code Division Multiple Access encoding.

It should be understood that the terminal device 900 may be corresponding to the terminal devices in the foregoing method embodiments, and may have corresponding functions of the terminal device in the methods. For brevity, details are not described herein again.

Figure 10:
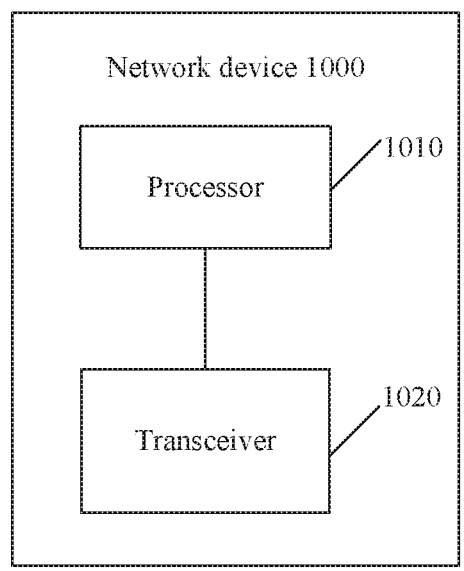
FIG. 10 is a schematic block diagram of a network device according to an embodiment of this application.

FIG. 10 is a schematic block diagram of a network device 1000 according to an embodiment of this application. As shown in FIG. 10, the network device 1000 includes a transceiver 1020 and a processor 1010.

It should be understood that the network device 1000 may be corresponding to the network device in the foregoing method embodiments, and may have any function of the network devices in the methods. For brevity, some functions of the network device shown in FIG. 2 are merely used as an example herein to describe the network device 1000, but this embodiment is not limited thereto.

The transceiver 1020 is configured to receive interleaved data sent by a terminal device, where the interleaved data is obtained after the terminal device interleaves data by using an interleaving pattern, and the interleaving pattern is obtained by the terminal device based on at least one of a cell identity of the terminal device, a terminal device identifier, time-domain resource information, and frequency-domain resource information.

The processor 1010 is configured to deinterleave the interleaved data by using the interleaving pattern.

Optionally, the interleaving pattern used by the terminal device to interleave the data is obtained by the terminal device based on at least one of the cell identity of the terminal device, the terminal device identifier, the time-domain resource information, and the frequency-domain resource information by using a formula.

Optionally, the interleaving pattern used by the terminal device to interleave the data is obtained by the terminal device based on the terminal device identifier n by using the following formulas:

$$\pi_i(j) = \mod(\pi(j)+a, K), 0 = 1, \ldots, K-1, \text{ and}$$

$$a = \mod(n, K), \text{ where}$$

$\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix includes K columns, where K is a positive integer; and mod represents modulo processing.

Optionally, the interleaving pattern used by the terminal device to interleave the data is obtained by the terminal device based on the terminal device identifier n by using the following formulas:

$$\pi_i(x) = \mod(a+f_1 x+f_2 x^2, K), x=0, \ldots, K-1, \text{ and}$$

$$a = \mod(n, K), \text{ where}$$

K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

Optionally, the data is data that is encoded by the terminal by using a Code Division Multiple Access coding scheme, the Code Division Multiple Access coding scheme is obtained by the terminal device from a Code Division Multiple Access coding scheme set by using a Code Division Multiple Access coding scheme index c, and the Code Division Multiple Access coding scheme is obtained by the terminal device based on the terminal device identifier n by using the following formula:

$$c = \mod(\lfloor n/K \rfloor, T), \text{ where}$$

T is a positive integer, and the Code Division Multiple Access coding scheme set includes T Code Division Multiple Access coding schemes; and the processor 1010 is further configured to:

decode the data by using the Code Division Multiple Access coding scheme.

Optionally, the transceiver 1020 is further configured to:

receive a pilot sent by the terminal device, where the pilot is obtained by the terminal device from a pilot set based on a pilot index b, where the pilot index b is obtained by the terminal device based on the terminal device identifier n by using the following formula:

$$b = \mod(n, KT), \text{ where}$$

K and T are positive integers, and the pilot set includes KT pilots.

Optionally, the interleaving pattern used by the terminal device to interleave the data is obtained by the terminal device based on the cell identity N of the terminal device, the terminal device identifier n, and a frame number or timeslot number m by using the following formulas:

$$\pi_i(j) = \mod(\pi(j) + a, K), 0 = 1, \ldots, K-1, \text{ and}$$

$$a = \mod\left(\sum_{s=0}^{7} f_p(8m+s)2^s + n, K\right),$$

where $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix includes K columns, where K is a positive integer; and mod represents modulo processing.

Optionally, the interleaving pattern used by the terminal device to interleave the data is obtained by the terminal device based on the cell identity N of the terminal device, the terminal device identifier n, and a frame number or timeslot number m by using the following formulas:

$$\pi_i(x) = \mod(a + f_1 x + f_2 x^2, K), x = 0, \ldots, K-1, \text{ and}$$

$$a = \mod\left(\sum_{s=0}^{7} f_p(8m+s)2^s + n, K\right),$$

where $f_p(.)$ is generated by using a pseudo random sequence, and an initial value $c_{init}$ is N; K is a size of a to-be-transmitted bit block, where K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

Optionally, the data is data that is encoded by the terminal by using a Code Division Multiple Access coding scheme, the Code Division Multiple Access coding scheme is obtained by the terminal device from a Code Division Multiple Access coding scheme set by using a Code Division Multiple Access coding scheme index c, and the Code Division Multiple Access coding scheme index c is obtained by the terminal device based on the cell identity N of the terminal device, the terminal device identifier n, and the frame number or timeslot number m by using the following formula:

$$c = \mod\left(\sum_{s=0}^{7} f_p(8m+s)2^s + n/K, T\right),$$

where

T is a positive integer, and the Code Division Multiple Access coding scheme set includes T Code Division Multiple Access coding schemes; and the processor 1010 is further configured to:

decode the data by using the Code Division Multiple Access coding scheme.

Optionally, the transceiver 1020 is further configured to:

receive a pilot sent by the terminal device, where the pilot is obtained by the terminal device from a pilot set based on a pilot index b, where the pilot index b is obtained by the terminal device based on the terminal device identifier n, the cell identity N of the terminal device, and the frame number or timeslot number m by using the following formula:

$$b = \mod\left(\sum_{s=0}^{7} f_p(8m+s)2^s + n, KT\right);$$

where

K and T are positive integers, and the pilot set includes KT pilots.

It should be understood that the processor 910 and/or the processor 1010 in the embodiments of this application may be implemented by a processing unit or a chip. Optionally, during an implementation process, the processing unit may include a plurality of units, such as an interleaving unit and a Multiple Access coding unit.

It should be understood that the transceiver 920 and/or the transceiver 1020 in the embodiments of this application may be implemented by a transceiver unit or a chip. Optionally, the transceiver 920 or the transceiver 1020 may include a transmitter or a receiver, or include a sending unit or a receiving unit.

Optionally, the network device or the terminal device may further include a memory. The memory may store program code, and the processor invokes the program code stored in the memory, to implement a corresponding function of the network device or the terminal device.

The apparatus in the implementations of this application may be a field-programmable gate array (Field-Programmable Gate Array, FPGA), an application-specific integrated circuit (Application Specific Integrated Circuit, ASIC), a system on chip (System on Chip, SoC), a central processing unit (Central Processing Unit. CPU), a network processor (Network Processor, NP), a digital signal processor (Digital Signal Processor. DSP), a microcontroller (Micro Controller Unit, MCU), a programmable controller (Programmable Logic Device, PLD), or another integrated chip.

An implementation of this application further includes a communications system, including the network device in the network device embodiment and the terminal device in the terminal device embodiment. A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again. For convenience and brevity, mutual reference may be made to the method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected depending on actual requirements to achieve the objectives of the solutions of the embodiments.

In addition, functional units in the embodiments of this application may be integrated into one processing unit, or each of the units may exist alone physically, or at least two units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (Read-Only Memory, ROM), a random-access memory (Random Access Memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A grant-free transmission method, comprising:
obtaining, by a terminal device, an interleaving pattern based on at least one of a cell identity of the terminal device, a terminal device identifier, time-domain resource information, or frequency-domain resource information by using a formula;
interleaving data based on the obtained interleaving pattern, to obtain interleaved data; and
sending the interleaved data,
wherein the obtaining, by the terminal device, the interleaving pattern based on at least one of the cell identity of the terminal device, the terminal device identifier, the time-domain resource information, and the frequency-domain resource information by using the formula comprising:
obtaining the interleaving pattern based on the terminal device identifier n by using the following formulas:

$\pi_i(j) = \text{mod}(\pi(j)+a, K), 0=1, \ldots, K-1$, and $a = \text{mod}(n, K)$, wherein $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix comprises K columns, wherein K is a positive integer; and mod represents modulo processing,
obtaining the interleaving pattern based on the terminal device identifier n by using the following formulas:

$\pi_i(x) = \text{mod}(a + f_1 x + f_2 x^2, K), x = 0, \ldots, K-1$, and $a = \text{mod}(n, K)$, wherein K is a size of a to-be-transmitted bit block, wherein K is a positive integer; values of $f_1$ and $f_2$ are related to K; a represents a quantity of times that cyclic shift is performed on an input bit; x represents a sequence number of the input bit; and $\pi_i(X)$ represents a sequence number for outputting an interleaved input bit,
obtaining the interleaving pattern based on the cell identity N of the terminal device, the terminal device identifier n, and a frame number or timeslot number m by using the following formulas:

$\pi_i(j) = \text{mod}(\pi(j) + a, K), 0 = 1, \ldots, K-1$, and $a = \text{mod}\left(\sum_{s=0}^{7} f_P(8m+s)2^s + n, K\right)$, wherein
$f_p(.)$ is generated by using a pseudo random sequence, and an initial value $c_{init}$ is N; $\pi(i)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix comprises K columns, wherein K is a positive integer; and mod represents modulo processing, and
obtaining the interleaving pattern based on the cell identity N of the terminal device, the terminal device identifier n, and a frame number or timeslot number m by using the following formulas:

$\pi_i(x) = \text{mod}(a + f_1 x + f_2 x^2, K), x = 0, \ldots, K-1$, and $a = \text{mod}\left(\sum_{s=0}^{7} f_P(8m+s)2^s + n, K\right)$, wherein
$f_p(.)$ is generated by using a pseudo random sequence, and an initial value $c_{init}$ is N; K is a size of a to-be-transmitted bit block, wherein K is a positive integer; values of $f_1$ and $f_2$ are related to K; a represents a quantity of times that cyclic shift is performed on an input bit x represents a sequence number of the input bit and $\pi_i(X)$ represents a sequence number for outputting an interleaved input bit.

2. A terminal device, comprising a processor and a transceiver, wherein
the processor is configured to: obtain an interleaving pattern based on at least one of a cell identity of the terminal device, a terminal device identifier, time-domain resource information, and frequency-domain resource information by using a formula; and interleave data based on the obtained interleaving pattern, to obtain interleaved data; and
the transceiver is configured to send the interleaved data,
wherein the processor is specifically configured to:
obtain the interleaving pattern based on the terminal device identifier n by using the following formulas:

$\pi_i(j) = \text{mod}(\pi(j)+a, K), 0=1, \ldots, K-1$, and $a = \text{mod}(n, K)$, wherein $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix comprises K columns, wherein K is a positive integer; and mod represents modulo processing,
obtain the interleaving pattern based on the terminal device identifier n by using the following formulas:

$\pi_i(x) = \text{mod}(a + f_1 x + f_2 x^2, K), x = 0, \ldots, K-1$, and $a = \text{mod}(n, K)$, where K is a size of a to-be-transmitted bit block, wherein K is a positive integer; values of $f_1$ and $f_2$ are related to K; a represents a quantity of times that cyclic shift is performed on an input bit x represents a sequence number of the input bit, and $\pi_i(x)$ represents a sequence number for outputting an interleaved input bit,
obtain the interleaving pattern based on the cell identity N of the terminal device, the terminal device identifier n, and a frame number or timeslot number m by using the following formulas:

$$\pi_i(j) = \mathrm{mod}(\pi(j) + a, K), \ 0 = 1, \ldots, K-1, \text{ and}$$

$$a = \mathrm{mod}\left(\sum_{s=0}^{7} f_P(8m+s)2^s + n, K\right),$$

wherein $f_p(.)$ is generated by using a pseudo random sequence, and an initial value $c_{init}$ is N; $\pi(j)$ is an initial ranking number of a column j of a base interleaving matrix corresponding to the interleaving pattern; $\pi_i(j)$ is a ranking number of the column j after the column j is interleaved; a represents a quantity of times that cyclic shift is performed on initial ranking corresponding to $\pi(j)$; n is the terminal device identifier; the base interleaving matrix comprises K columns, wherein K is a positive integer; and mod represents modulo processing, and obtain the interleaving pattern based on the cell identity N of the terminal device, the terminal device identifier n, and a frame number or timeslot number m by using the following formulas:

$$\pi_i(x) = \mathrm{mod}(a + f_1 x + f_2 x^2, K), \ x = 0, \ldots, K-1, \text{ and}$$

$$a = \mathrm{mod}\left(\sum_{s=0}^{7} f_P(8m+s)2^s + n, K\right),$$

wherein $f_p(.)$ is generated by using a pseudo random sequence, and an initial value $c_{init}$ is N; K is a size of a to-be-transmitted bit block, wherein K is a positive integer; values of $f_1$ and $f_2$ are related to K; a represents a quantity of times that cyclic shift is performed on an input bit; x represents a sequence number of the input bit; and $\pi_i(x)$ represents a sequence number for outputting an interleaved input bit.

3. The terminal device according to claim 2, wherein the processor is further configured to:

obtain a Code Division Multiple Access coding scheme index c based on the terminal device identifier n by using the following formula:

$c = \mathrm{mod}(\lfloor n/K \rfloor, T)$, wherein

T is a positive integer, and $\lfloor \ \rfloor$ represents rounding down to a nearest integer;

select a Code Division Multiple Access coding scheme from a Code Division Multiple Access coding scheme set based on the Code Division Multiple Access coding scheme index, wherein the Code Division Multiple Access coding scheme set comprises T Code Division Multiple Access coding schemes; and perform Code Division Multiple Access encoding on the data based on the selected Code Division Multiple Access coding scheme; and the transceiver is specifically configured to send data obtained through interleaving and Code Division Multiple Access encoding.

4. The terminal device according to claim 2, wherein the processor is further configured to:

obtain a pilot index b based on the terminal device identifier n by using the following formula:

$b = \mathrm{mod}(n, KT)$, wherein

T is a positive integer; and obtain a pilot sequence from a pilot sequence set based on the pilot index b, wherein the pilot sequence set comprises KT pilot sequences; and the transceiver is further configured to send the obtained pilot sequence.

5. The terminal device according to claim 2, wherein the processor is further configured to:

generate a pilot index based on at least one of the cell identity of the terminal device, the terminal device identifier, the time-domain resource information, and the frequency-domain resource information by using a formula; and select a pilot sequence from a pilot sequence set based on the generated pilot index; and the transceiver is further configured to send the selected pilot sequence.

* * * * *